US007327170B2

(12) United States Patent
Omori et al.

(10) Patent No.: US 7,327,170 B2
(45) Date of Patent: Feb. 5, 2008

(54) CURRENT DRIVER

(75) Inventors: Tetsuro Omori, Osaka (JP); Yoshito Date, Shiga (JP); Makoto Mizuki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/223,944

(22) Filed: Sep. 13, 2005

(65) Prior Publication Data

US 2006/0097759 A1 May 11, 2006

(30) Foreign Application Priority Data

Nov. 8, 2004 (JP) ............................ 2004-323450

(51) Int. Cl.
*H03K 3/00* (2006.01)
*G05F 1/10* (2006.01)

(52) U.S. Cl. ...................................... 327/108; 327/540

(58) Field of Classification Search ........ 327/108-112, 327/538-541
See application file for complete search history.

(56) References Cited

U.S. PATENT DOCUMENTS

| | | | | |
|---|---|---|---|---|
| 5,166,702 | A | 11/1992 | Mattern et al. | |
| 5,519,310 | A * | 5/1996 | Bartlett | 323/316 |
| 5,572,161 | A * | 11/1996 | Myers | 327/538 |
| 5,581,197 | A * | 12/1996 | Motley et al. | 326/30 |
| 5,694,033 | A * | 12/1997 | Wei et al. | 323/315 |
| 6,057,721 | A * | 5/2000 | Nolan et al. | 327/143 |
| 6,414,512 | B1 * | 7/2002 | Moyer | 326/30 |
| 6,504,397 | B1 * | 1/2003 | Hart et al. | 326/30 |
| 6,522,185 | B2 * | 2/2003 | Helt et al. | 327/276 |
| 6,552,565 | B2 * | 4/2003 | Chang et al. | 326/30 |
| 6,747,417 | B2 | 6/2004 | Meade et al. | |
| 6,774,572 | B2 | 8/2004 | Fukuzako | |
| 6,897,618 | B2 | 5/2005 | Fukuzako | |
| 7,132,821 | B2 * | 11/2006 | Camara et al. | 323/315 |
| 2004/0178742 | A1 | 9/2004 | Date et al. | |
| 2004/0227499 | A1 | 11/2004 | Date et al. | |
| 2005/0073513 | A1 | 4/2005 | Date | |

FOREIGN PATENT DOCUMENTS

WO WO 2004/025614 A1 3/2004

* cited by examiner

*Primary Examiner*—Kenneth B. Wells
(74) *Attorney, Agent, or Firm*—McDermott Will & Emery LLP

(57) ABSTRACT

A current driver outputs an output current according to a reference current. The current driver includes: a current-voltage converter; a bias-voltage generating transistor; a differential amplifier; and a driving transistor. The converter has a given resistance value and is connected between a first node and a second node. The bias-voltage generating transistor is provided between the first and second nodes and connected in series with the converter. The amplifier outputs a voltage according to the difference between a voltage at an interconnecting node between the converter and the bias-voltage generating transistor and a voltage according to the reference current at a third node. The driving transistor is connected between an output current node outputting an output current and the second node and receives, at its gate, the voltage from the amplifier. The bias-voltage generating transistor receives, at its gate, the voltage from the amplifier.

14 Claims, 22 Drawing Sheets

CURRENT DRIVER

CROSS-REFERENCE TO RELATED APPLICATION

This application claims priority under 35 U.S.C. §119 on Patent Application No. 2004-323450 filed in Japan on Nov. 8, 2004, the entire contents of which are hereby incorporated by reference.

BACKGROUND OF THE INVENTION (1) Field of the Invention

The present invention relates to current drivers and particularly to current drivers usable as apparatus such as display drivers for organic EL (electro luminescence) panels and the like.

(2) Description of Related Art

FIG. 22 illustrates an overall configuration of a conventional current driver 30. The conventional current driver 30 uses a reference current $I_{ref}$ from a reference current source REF (or a current driver at the previous stage) as an input and includes: a setting reference transistor T3001L; a supply reference transistor T3001R; a bias voltage generating transistor T3003; and driving transistors T3004*a* and T3004*b*.

The setting reference transistor T3001L is provided between a power supply node Vdd and the reference current source REF and has its gate and drain connected to each other. The supply reference transistor T3001R is provided between a power supply node Vdd and the bias voltage generating transistor T3003 and has its gate connected to the gate of the setting reference transistor T3001L. The bias voltage generating transistor T3003 is provided between the supply reference transistor T3001R and a ground node and has its gate connected to the gates of the driving transistors T3004*a* and T3004*b*. Each of the driving transistors T3004*a* and T3004*b* is provided between a display element circuit (not shown) and a ground node.

Now, it will be described how the current driver 30 illustrated in FIG. 22 operates. In the conventional current driver 30, a current mirror formed by the setting reference transistor T3001L, the supply reference transistor T3001R and the bias voltage generating transistor T3003 generates a bias voltage $V_{bias}$ from the reference current $I_{ref}$. Each of the driving transistors T3004*a* and T3004*b* receives, at its gate, the bias voltage $V_{bias}$ generated by the current mirror and generates an output current $I_{out}$. In this manner, output currents $I_{out}$ are caused to flow uniformly, thereby current-driving a plurality of display element circuits in a display panel.

In the conventional current driver, however, in order to enhance the accuracy (current mirror accuracy) of the ability of generating an output current $I_{out}$ having a current value equal to or proportional to the current value of the reference current $I_{ref}$, the current value of the reference current $I_{ref}$ input to the current mirror needs to be increased. With the foregoing method, electric power cannot be used effectively, and heavy loads are placed on the transistors T3001R and T3001L forming the current mirror. In addition, in the conventional current driver, a bias voltage ($V_{bias}$) varies because of transistor capacitive coupling, so that the current values of output currents $I_{out}$ can vary.

SUMMARY OF THE INVENTION

According to an aspect of the present invention, a current driver outputs an output current having a current value according to the current value of a reference current. The current driver includes: a current-voltage converter; a bias voltage generating transistor; a differential amplifier; and a driving transistor. The current-voltage converter is connected between a first node receiving a first voltage and a second node receiving a second voltage. The bias voltage generating transistor is provided between the first node and the second node and connected in series with the current-voltage converter. A third node receives a third voltage having a voltage value according to the current value of the reference current. The differential amplifier outputs a fifth voltage having a voltage value according to the difference between a fourth voltage at an interconnecting node provided between the current-voltage converter and the bias voltage generating transistor and the third voltage at the third node. The driving transistor is connected between the second node and an output current node at which the output current is output, and receiving, at a gate thereof, the fifth voltage output from the differential amplifier. The current-voltage converter has a given resistance value. The bias voltage generating transistor receives, at a gate thereof, the fifth voltage output from the differential amplifier.

Preferably, the current-voltage converter includes a first transistor and a second transistor. The first transistor is connected between the first node and the fourth node and has a gate and a drain connected to each other. The second transistor is connected between the first node and the interconnecting node and has a gate connected to the gate of the first transistor. The reference current flows between the first node and the fourth node.

Preferably, the current driver further includes a connection switching section for switching between a first connection state and a second connection state. The connection switching section connects the first transistor between the first node and the fourth node, connects the gate and drain of the first transistor to each other, connects the second transistor between the first node and the interconnecting node, and connects the gate of the second transistor to the gate of the first transistor, in the first connection state. The connection switching section connects the second transistor between the first node and the fourth node, connects the gate and drain of the second transistor to each other, connects the first transistor between the first node and the interconnecting node, and connects the gate of the first transistor to the gate of the second transistor, in the second connection state.

Preferably, the current-voltage converter includes a first transistor and a bias voltage adjusting section. The first transistor is connected between the first node and a fourth node and has a gate and a drain connected to each other. The reference current flows between the first node and the fourth node. The bias voltage adjusting section is connected between the first node and the interconnecting node and has a resistance value according to the voltage value of a gate voltage generated at the gate of the first transistor. A relationship between the voltage value of the gate voltage and the resistance value of the bias voltage adjusting section according to the voltage value of the gate voltage is capable of being arbitrarily set.

Preferably, the current-voltage converter includes a gate voltage adjusting section and a first transistor. The reference current flows between the first node and a fourth node. The gate voltage adjusting section is connected between the first node and the fourth node and generates a gate voltage having a voltage value according to the current value of the reference current. The first transistor is connected between the first node and the interconnecting node and receives, at a gate thereof, the gate voltage generated by the gate voltage adjusting section. A relationship between the current value of the reference current and the voltage value of the gate voltage generated by the gate voltage adjusting section according to the current value of the reference current is capable of being arbitrarily set.

Preferably, the current-voltage converter includes a first resistance and a second resistance. The first resistance is connected between the first node and the third node. The second resistance is connected between the first node and the interconnecting node. The reference current flows between the first node and the third node.

Preferably, the current driver further includes a connection switching section for switching between a first connection state and a second connection state. The connection switching section connects the first resistance between the first node and the third node and connects the second resistance between the first node and the interconnecting node, in the first connection state. The connection switching section connects the first resistance between the first node and the interconnecting node and connects the second resistance between the first node and the third node, in the second connection state.

Preferably, the second resistance has a resistance value capable of being set at an arbitrary value.

Preferably, the differential amplifier includes: a first transistor, a third transistor, a second transistor and a fourth transistor. The first transistor and the third transistor are connected in series between the first node and the second node. The second transistor and the fourth transistor are connected in series between the first node and the second node. The first transistor is connected between the first node and the third transistor and receives, at a gate thereof, the fourth voltage at the interconnecting node. The second transistor is connected between the first node and the fourth transistor and receives, at a gate thereof, the third voltage at the third node. The third transistor is connected between the first transistor and the second node and has a drain and a gate connected to each other. The fourth transistor is connected between the second transistor and the second node and has a gate connected to the gate of the third transistor.

Preferably, the differential amplifier further includes a connection switching section for switching between a first connection state and a second connection state. The connection switching section connects the first transistor between the first node and the third transistor, connects the second transistor between the first node and the fourth transistor, applies the fourth voltage at the interconnecting node to the gate of the first transistor and applies the third voltage at the third node to the gate of the second transistor, in the first connection state. The connection switching section connects the first transistor between the first node and the fourth transistor, connects the second transistor between the first node and the third transistor, applies the fourth voltage at the interconnecting node to the gate of the second transistor and applies the third voltage at the third node to the gate of the first transistor, in the second connection state.

Preferably, the gate of the third transistor is connected to the gate of the fourth transistor. The differential amplifier further includes a connection switching section for switching between a first connection state and a second connection state. The connection switching section applies the fourth voltage at the interconnecting node to the gate of the first transistor, applies the third voltage at the third node to the gate of the second transistor and connects the gate and drain of the fourth transistor to each other, in the first connection state. The connection switching section applies the fourth voltage at the interconnecting node to the gate of the second transistor, applies the third voltage at the third node to the gate of the first transistor and connects the gate and drain of the third transistor to each other, in the second connection state.

DETAILED DESCRIPTION OF THE INVENTION

Figure 1:
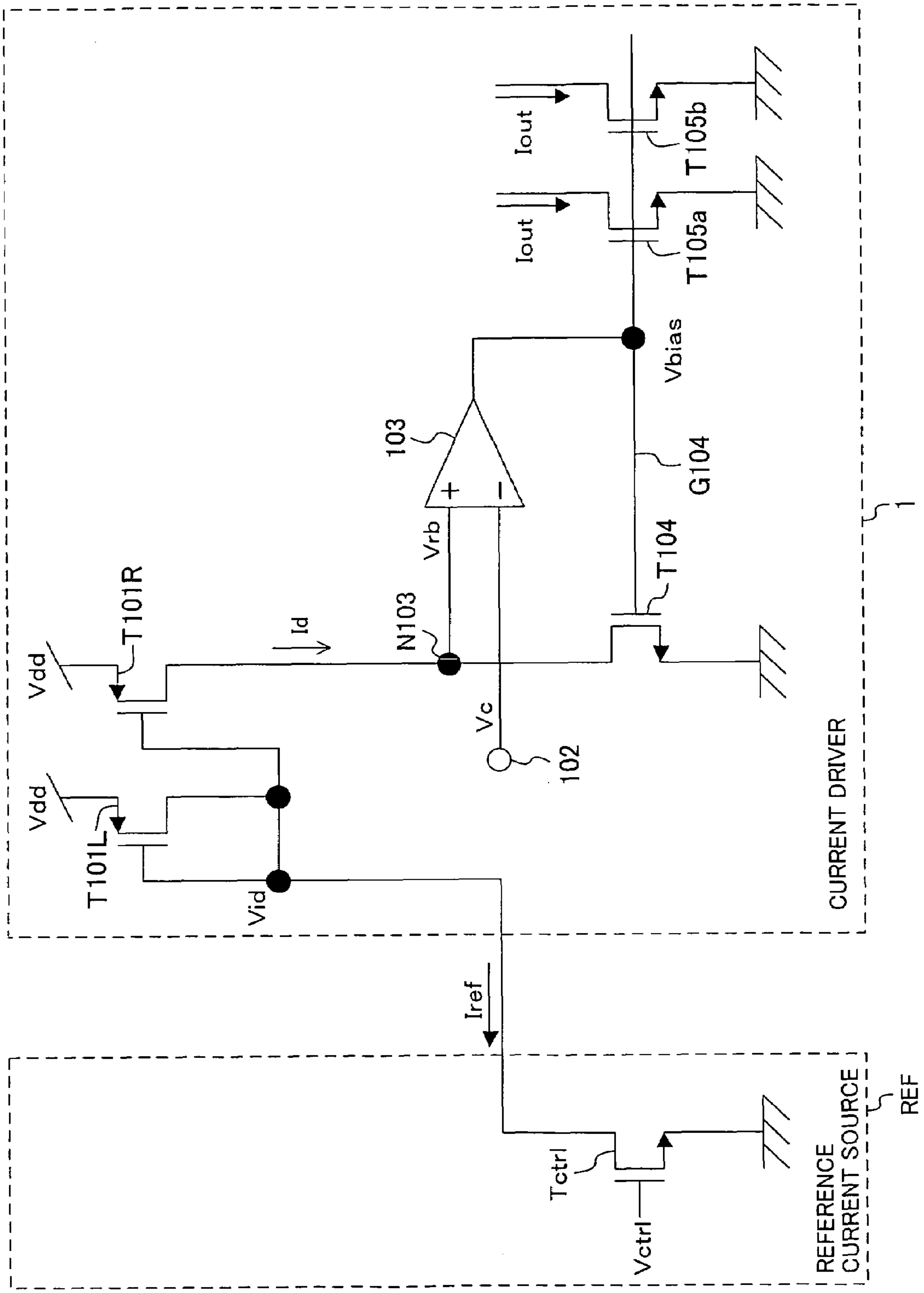
FIG. 1 is a view illustrating an overall configuration of a current driver according to a first embodiment of the present invention.

Hereinafter, embodiments of the present invention will be described in detail with reference to the drawings. The same or like components are denoted by the same reference numerals in the drawings and the descriptions thereof are not repeated.

EMBODIMENT 1

<Overall Configuration>

FIG. 1 illustrates an overall configuration of a current driver 1 according to a first embodiment of the present invention. The current driver 1 supplies a current to a plurality of display element circuits (not shown) such as organic EL devices, receives a reference current $I_{ref}$ supplied from a reference current source REF, and outputs, to the display element circuits, output currents $I_{out}$ having current values equal to or proportional to the current value of the received reference current $I_{ref}$ (i.e., output currents $I_{out}$ each having a current value obtained by multiplying the current value of the reference current $I_{ref}$ by a desired factor). This current driver 1 includes: current-voltage converting transistors T101R and T101L; a reference voltage supplying terminal 102; a differential amplifier 103; a bias voltage generating transistor T104; and driving transistors T105*a* and T105*b*.

The current-voltage converting transistors T101R and T101L form a current mirror. When a reference current $I_{ref}$ flows in the current-voltage converting transistor T101L, a drain current $I_d$ having a current value according to the mirror ratio of the current mirror flows in the current-voltage converting transistor T101R.

The current-voltage converting transistor T101L is provided between an internal power supply node Vdd and the reference current source REF and has its gate connected to the drain of the current-voltage converting transistor T101L and the gate of the current-voltage converting transistor T101R. Accordingly, when a reference current $I_{ref}$ flows in the current-voltage converting transistor T101L, a gate voltage $V_{id}$ having a voltage value according to the current value of the reference current $I_{ref}$ is generated at the gate of the current-voltage converting transistor T101L.

The current-voltage converting transistor T101R and the bias voltage generating transistor T104 are connected in series between an internal power supply node Vdd and a ground node GND. The current-voltage converting transistor T101R is provided between the internal power supply node Vdd and a node N103 and has its gate connected to the gate of the current-voltage converting transistor T101L. Channel resistance of the current-voltage converting transistor T101R has a resistance value according to the voltage value of a gate voltage $V_{id}$ applied to the gate thereof. Channel resistance of the bias voltage generating transistor T104 has a resistance value according to the voltage value of a bias voltage $V_{bias}$ applied to the gate thereof. Accordingly, a drain current $I_d$ having a current value according to the channel resistance value of the current-voltage converting transistor T101R and the channel resistance value of the bias voltage generating transistor T104 flows in the current-voltage converting transistor T101R and the bias voltage generating transistor T104. At the node N103, a drain voltage $V_{rb}$ having a voltage value according to a voltage drop in the current-voltage converting transistor T101R is generated.

The reference voltage supplying terminal 102 supplies a reference voltage $V_c$ to the inverting input terminal of the differential amplifier 103. In this embodiment, it is assumed that the reference voltage $V_c$ is a voltage allowing saturation operation of the current-voltage converting transistor T101R and has a voltage value approximately equal to the voltage value of the gate voltage $V_{id}$.

The differential amplifier 103 and the bias voltage generating transistor T104 form a negative feedback circuit and are controlled such that the voltage value of the drain voltage $V_{rb}$ is equal to the voltage value of the reference voltage $V_c$.

The differential amplifier 103 has its non-inverting input terminal connected to the node N103, its inverting input terminal connected to the reference voltage supplying terminal 102, and its output terminal connected to a gate line G104. The differential amplifier 103 outputs a bias voltage $V_{bias}$ having a voltage value according to the difference between the voltage value of the drain voltage $V_{rb}$ generated at the node N103 and the voltage value of the reference voltage $V_c$ supplied from the reference voltage supplying terminal 102.

The bias voltage generating transistor T104 is provided between the node N103 and the ground node and has its gate connected to the gate line G104. When the bias voltage generating transistor T104 receives a bias voltage $V_{bias}$ at its gate, the resistance value of channel resistance of the bias voltage generating transistor T104 varies according to the voltage value of this bias voltage $V_{bias}$. Accordingly, the current value of the drain current $I_d$ flowing in the current-voltage converting transistor T101R and the bias voltage generating transistor T104 varies. The variation of the current value of the drain current $I_d$ causes the degree of the voltage drop in the current-voltage converting transistor T101R to vary.

The bias voltage generating transistor T104 and each of the driving transistors T105*a* and T105*b* form a current mirror. When a drain current $I_d$ flows in the bias voltage generating transistor T104, an output current $I_{out}$ having a current value according to the mirror ratio of the current mirror flows in each of the driving transistors T105*a* and T105*b*.

Each of the driving transistors T105*a* and T105*b* is provided between a display element circuit (now shown) and a ground node and has its gate connected to the gate line G104. In each of the driving transistors T105*a* and T105*b*, an output current $I_{out}$ having a current value according to the voltage value of the bias voltage $V_{bias}$ input to the gate line G104 flows.

In this embodiment, it is assumed that the current mirror formed by the current-voltage converting transistors T101R and T101L has a mirror ratio of "1:1". It is also assumed that the current mirror formed by the bias voltage generating transistor T104 and each of the driving transistors T105*a* and T105*b* has a mirror ratio of "1:1". That is, the current-voltage converting transistors T101R and T101L have the same I-V characteristic (i.e., the relationship between the voltage value of a gate voltage and the current value of a drain current flowing according to this gate voltage), and the driving transistors T105*a* and T105*b* have the same I-V characteristic.

<Operation>

Now, operation of the current driver 1 illustrated in FIG. 1 will be described.

First, a reference current $I_{ref}$ flows in the current-voltage converting transistor T101L connected to the reference current source REF. Since the gate and drain of the current-voltage converting transistor T101L are connected to each other, a gate voltage $V_{id}$ having a voltage value according to the current value of the reference current $I_{ref}$ is generated at the gate of the transistor T101L.

Next, channel resistance of the current-voltage converting transistor T101R has a resistance value according to the voltage value of the gate voltage $V_{id}$. Accordingly, a drain current $I_d$ having a current value according to the resistance value of channel resistance of the current-voltage converting transistor T101R and the resistance value of channel resistance of the bias voltage generating transistor T104 flows in the current-voltage converting transistor T101R and the bias voltage generating transistor T104. In the current-voltage converting transistor T101R, a voltage drop according to the resistance value of channel resistance of the transistor T101R and the current value of the drain current $I_d$ flowing in the transistor T101R occurs. Accordingly, a drain voltage $V_{rb}$ having a voltage value according to the voltage drop occurring in the current-voltage converting transistor T101R is generated at the node N103.

Then, the drain voltage $V_{rb}$ generated at the node N103 is input to the non-inverting input terminal of the differential amplifier 103. On the other hand, a reference voltage $V_c$ supplied from the reference voltage supplying terminal 102 is input to the inverting input terminal of the differential amplifier 103.

Thereafter, the differential amplifier 103 outputs, to the gate line G104, a bias voltage $V_{bias}$ having a voltage value according to the difference between the drain voltage $V_{rb}$ input to the non-inverting input terminal and the reference voltage $V_c$ input to the inverting input terminal. The bias voltage $V_{bias}$ input to the gate line G104 is input to the gate of the bias voltage generating transistor T104 and the gates of the driving transistors T105*a* and T105*b*.

Subsequently, in each of the driving transistors T105*a* and T105*b*, an output current $I_{out}$ according to the bias voltage $V_{bias}$ input to the gate thereof flows. In this manner, the output current $I_{out}$ flows in each display element circuit (not shown).

On the other hand, since the resistance value of the bias voltage generating transistor T104 varies according to the voltage value of the bias voltage $V_{bias}$ applied to the gate of the bias voltage generating transistor T104, the current value of the drain current $I_d$ flowing in the bias voltage generating transistor T104 (and the current-voltage converting transistor T101R) varies according to the voltage value of the bias voltage $V_{bias}$ input to the gate of the bias voltage generating transistor T104. In addition, the degree of the voltage drop in the current-voltage converting transistor T101R varies according to the variation of the current value of the drain current $I_d$, so that the voltage value of the drain voltage $V_{rb}$ generated at the node N103 also varies.

[The Case of (Current Value of Drain Current $I_d$)<(Current Value of Reference Current $I_{ref}$)]

Now, a case where the current value of the drain current $I_d$ flowing in the current-voltage converting transistor T101R is smaller than that of the reference current $I_{ref}$ flowing in the current-voltage converting transistor T101L will be described.

In this case, the voltage drop in the current-voltage converting transistor T101R is smaller than in a case where the current value of the drain current $I_d$ is equal to that of the reference current $I_{ref}$, so that the drain voltage $V_{rb}$ generated at the node N103 is higher than the reference voltage $V_c$ (the gate voltage $V_{id}$). Accordingly, the voltage value of the bias voltage $V_{bias}$, output from the differential amplifier 103 is larger than that of the bias voltage $V_{bias}$ output in the case where the drain voltage $V_{rb}$ and the reference voltage $V_c$ are equal to each other. This reduces the resistance value of channel resistance of the bias voltage generating transistor T104. As a result, the current value of the drain current $I_d$ flowing in the current-voltage converting transistor T101R and the bias voltage generating transistor T104 increases. The increase of the current value of the drain current $I_d$ increases the degree of the voltage drop in the current-voltage converting transistor T101R, so that the voltage value of the drain voltage $V_{rb}$ generated at the node N103 decreases.

[The Case of (Current Value of Drain Current $I_d$)>(Current Value of Reference Current $I_{ref}$)]

Now, a case where the drain voltage $V_{rb}$ of the current-voltage converting transistor T101R is lower than the reference voltage $V_c$ will be described.

In this case, the voltage drop in the current-voltage converting transistor T101R is larger than in a case where the current value of the drain current $I_d$ is equal to that of the reference current $I_{ref}$, so that the drain voltage $V_{rb}$ generated at the node N103 is lower than the reference voltage $V_c$ (the gate voltage $V_{id}$). Accordingly, the voltage value of the bias voltage $V_{bias}$ output from the differential amplifier 103 is smaller than that of the bias voltage $V_{bias}$ output in the case where the drain voltage $V_{rb}$ and the reference voltage $V_c$ are equal to each other. This increases the resistance value of channel resistance of the bias voltage generating transistor T104. As a result, the current value of the drain current $I_d$ flowing in the current-voltage converting transistor T101R and the bias voltage generating transistor T104 decreases. The decrease of the current value of the drain current $I_d$ reduces the degree of the voltage drop in the current-voltage converting transistor T101R, so that the voltage value of the drain voltage $V_{rb}$ generated at the node N103 increases.

In this manner, the increase/decrease of the resistance value of channel resistance of the bias voltage generating transistor T104 makes the current value of the drain current $I_d$ closer to the current value of the reference current $I_{ref}$.

To make the current value of an output current $I_{out}$ twice as large as that of the reference current $I_{ref}$, it is sufficient to make the I-V characteristic of the current-voltage converting transistor T101R half of the I-V characteristic of the current-voltage converting transistor T101L. In this case, the channel resistance of the current-voltage converting transistor T101R is reduced by half. Accordingly, when the current value of the drain current $I_d$ flowing in the current-voltage converting transistor T101R and the bias voltage generating transistor T104 doubles, the voltage value of the drain voltage $V_{rb}$ generated at the node N103 and the voltage value of the reference voltage $V_c$ are equalized. Even if the mirror ratio of the current mirror formed by the bias voltage generating transistor T104 and each of the driving transistors T105*a* and T105*b* is set at "1:2", the current value of the output current $I_{out}$ is twice as large as that of the reference current $I_{ref}$ in the same manner.

<Effects>

As described above, in the current driver of this embodiment, the voltage value of the drain voltage $V_{rb}$ of the current-voltage converting transistor T101R comes closer to that of the reference voltage $V_c$ (=the drain voltage of the current-voltage converting transistor T101L). Accordingly, the influence of the drain voltage dependence (Early effect) is reduced. In this manner, an output current $I_{out}$ having a current value equal to or proportional to the current value of the reference current $I_{ref}$ is capable of being output, thus implementing a current driver having a high current-mirror accuracy.

The differential amplifier 103 has low output impedance, so that the voltage drop occurring in the differential amplifier 103 is small. Accordingly, electric power is used more effectively than in conventional current drivers.

In addition, the differential amplifier 103 has high input impedance, so that small electric loads are placed on the current-voltage converting transistors T101R and T101L forming a current mirror.

Moreover, a negative feedback circuit formed by the differential amplifier and the bias voltage generating transistor eliminates variations of the bias voltage $V_{bias}$ and the output current $I_{out}$ under the influence of transistor capacitive coupling.

The current driver 1 of this embodiment receives a reference current $I_{ref}$ and generates an output current $I_{out}$ using the received reference current $I_{ref}$. Accordingly, when such current drivers 1 are arranged in series, each of the current drivers receives an output current $I_{out}$ from the current driver at the previous stage, so that a large-scale current driving apparatus is configured.

In this embodiment, two driving transistors are provided in the current driver 1. However, the number of driving transistors is not limited to this, and can be increased/reduced according to the number of display element circuits.

EMBODIMENT 2

<Overall Configuration>

Figure 2:
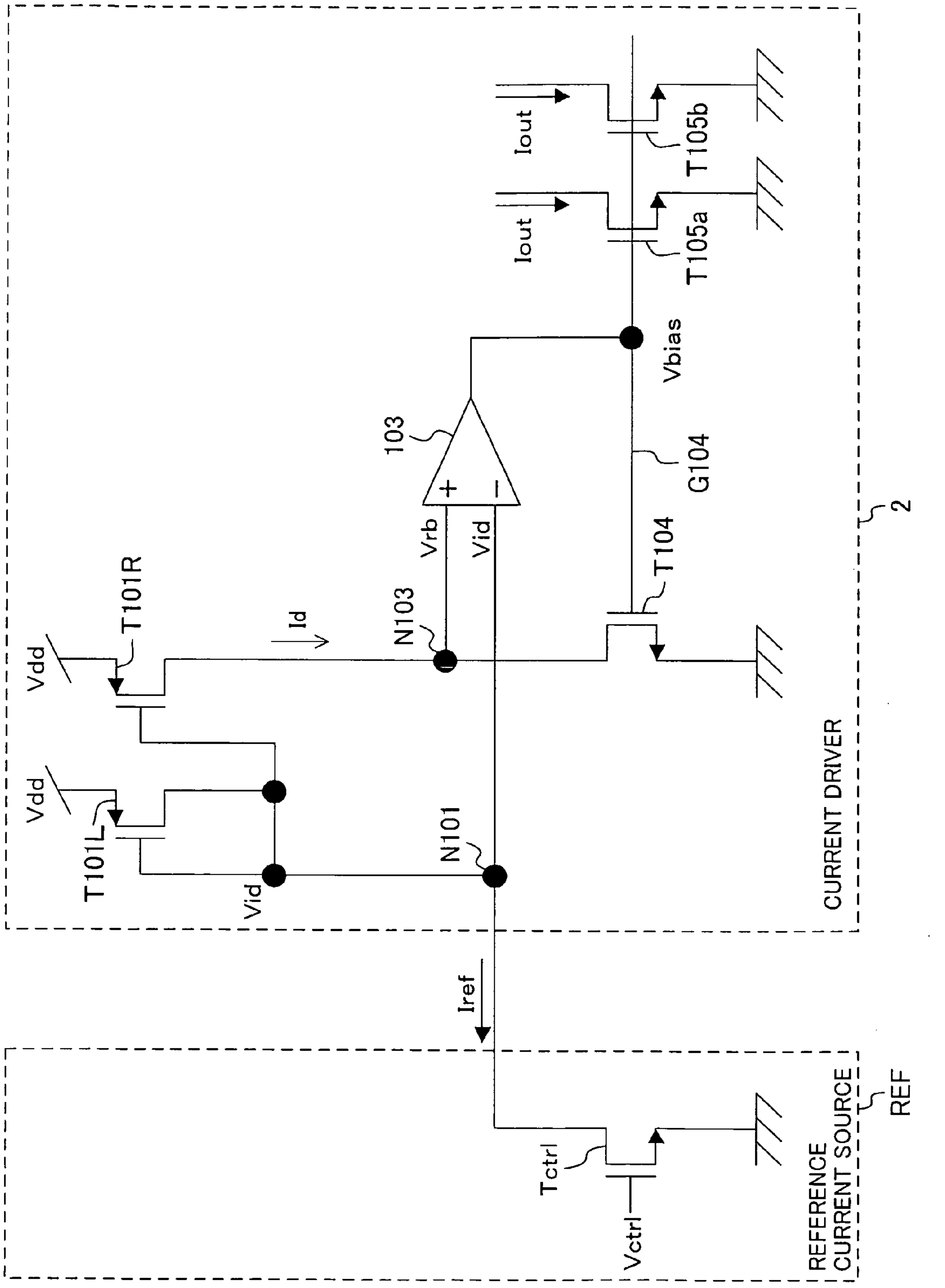
FIG. 2 is a view illustrating an overall configuration of a current driver according to a second embodiment of the present invention.

FIG. 2 illustrates an overall configuration of a current driver 2 according to a second embodiment of the present invention. The current driver 2 has a configuration in which a gate voltage $V_{id}$ generated at the gate of a current-voltage converting transistor T101L is supplied to a differential amplifier 103, instead of the configuration in which a reference voltage supplying terminal 102 for supplying a reference voltage $V_c$ to the differential amplifier 103 is provided as in the current driver 1 illustrated in FIG. 1. That is, in the current driver 2, the reference voltage supplying terminal 102 illustrated in FIG. 1 is omitted. A reference current source REF is connected to a node N101. The current-voltage converting transistor T101L is provided between an internal power supply node Vdd and the node N101. The differential amplifier 103 receives, at its inverting input terminal, a gate voltage $V_{id}$ generated at the gate of the current-voltage converting transistor T101L. The other part of the configuration is the same as that illustrated in FIG. 1.

<Operation>

Operation of the current driver 2 illustrated in FIG. 2 is the same as that of the current driver 1 except for operation of the differential amplifier 103.

The differential amplifier 103 outputs, to a gate line G104, a bias voltage $V_{bias}$ according to the difference between a drain voltage $V_{rb}$ input to the non-inverting input terminal and a gate voltage $V_{id}$ input to the inverting input terminal.

<Effects>

As described above, the gate voltage $V_{id}$ generated at the gate of the current-voltage converting transistor T101L is supplied to the differential amplifier 103 without generation of a reference voltage $V_c$, so that a current driver having a configuration simpler than that of the first embodiment is implemented.

EMBODIMENT 3

<Influence of Variation Between Transistors>

In a current mirror, when the I-V characteristic of a transistor at the input side differs from that of a transistor at the output side, an error due to the characteristic difference between these transistors occurs between the current value of a current input to the current mirror and the current value of a current output from the current mirror, so that the current-value ratio between a reference current flowing in the input-side transistor and a drain current flowing in the output-side transistor does not match with the mirror ratio. For example, suppose a current flowing in the current-voltage converting transistor T101R is larger than a current flowing in the current-voltage converting transistor T101L when an identical gate voltage is input to the current-voltage converting transistors T101R and T101L, the voltage value of a bias voltage $V_{bias}$ generated by the differential amplifier 103 is larger than that the bias voltage $V_{bias}$ should originally have. Accordingly, the current value of an output current $I_{out}$ of the current driver is always larger than that of a reference current $I_{ref}$. If errors in output currents $I_{out}$ are inclined toward one direction because of the characteristic difference between transistors in that way, light-emission luminance of a display panel changes markedly in driving the display panel using a plurality of current drivers.

<Overall Configuration>

Figure 3:
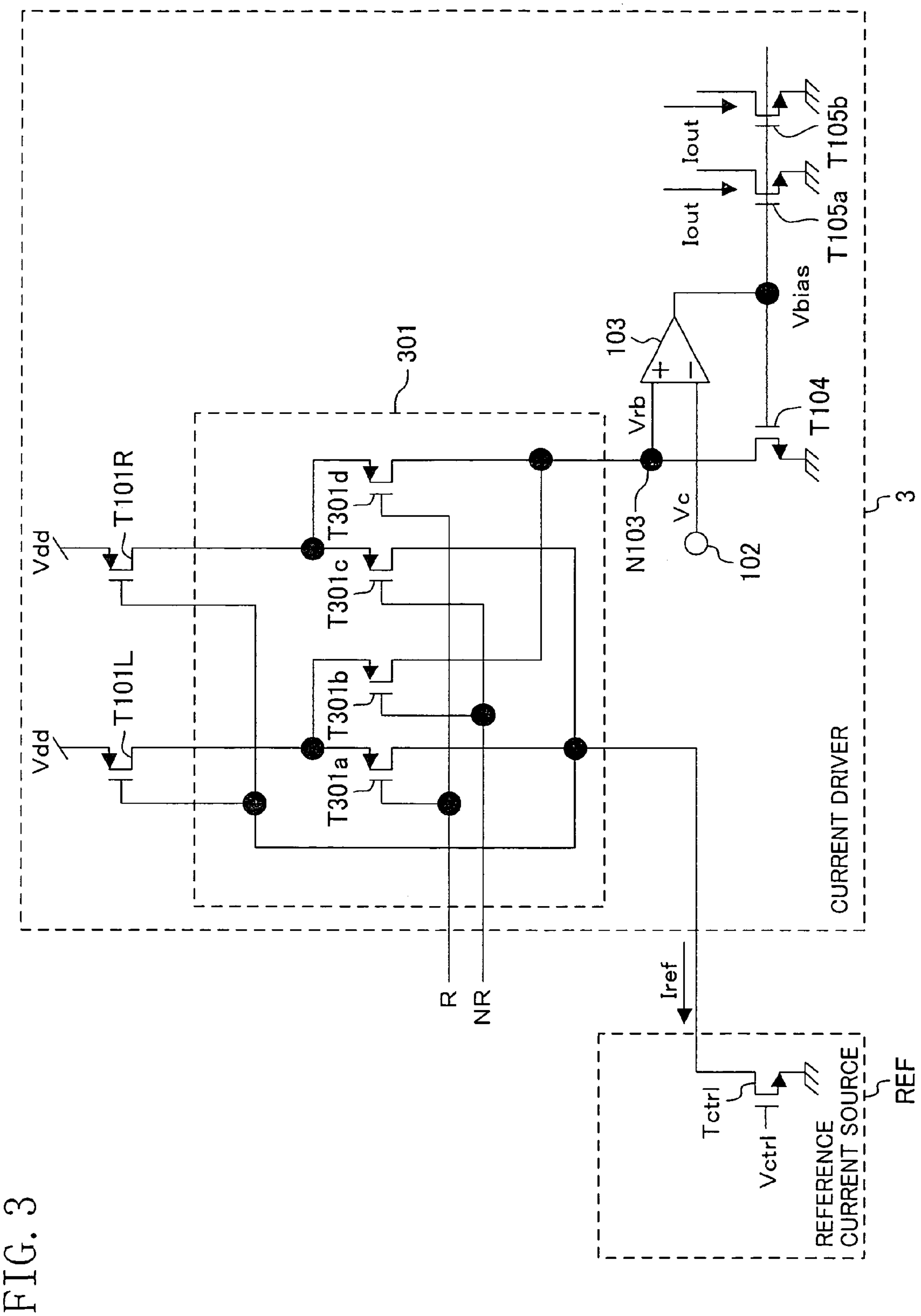
FIG. 3 is a view illustrating an overall configuration of a current driver according to a third embodiment of the present invention.

FIG. 3 illustrates an overall configuration of a current driver 3 according to a third embodiment of the present invention. The current driver 3 further includes a connection switching section 301, in addition to the components of the current driver 1 illustrated in FIG. 1. The other part of the configuration is the same as that illustrated in FIG. 1. The connection switching section 301 is provided between the side of current-voltage converting transistors T101R and T101L and the side of a reference current source REF and a node N103. The connection switching section 301 connects one of the current-voltage converting transistors T101R and T101L to the reference current source REF and the other to the node N103, according to control signals R and NR input from outside the driver. That is, the current driver 3 replaces the locations of the current-voltage converting transistors T101R and T101L with each other according to the control signals R and NR.

In this embodiment, it is assumed that a current mirror formed by the current-voltage converting transistors T101R and T101L has a mirror ratio of "1:1".

<Internal Configuration of Connection Switching Section 301>

The connection switching section 301 illustrated in FIG. 3 includes switching transistors T301*a*, T301*b*, T301*c* and T301*d*.

The switching transistor T301*a* is provided between the drain of the current-voltage converting transistor T101L and the reference current source REF and receives a control signal R at its gate. The switching transistor T301*b* is provided between the drain of the current-voltage converting transistor T101L and the node N103 and receives a control signal NR at its gate. The switching transistor T301*c* is provided between the drain of the current-voltage converting transistor T101R and the reference current source REF and receives a control signal NR at its gate. The switching transistor T301*d* is provided between the drain of the current-voltage converting transistor T101R and the node N103 and receives a control signal R at its gate.

When the control signals R and NR are at the L level, these signals are voltages for activating the switching transistors T301*a* through T301*d* (pMOS transistors) whereas when the control signals R and NR are at the H level, these signals are voltages for inactivating the switching transistors T301*a* through T301*d* (pMOS transistors).

<Operation>

Now, operation of the connection switching section 301 illustrated in FIG. 3 will be described.

When the control signal R is at the L level (active) and the control signal NR is at the H level (inactive), the switching transistors T301*a* and T301*d* are activated and the switching transistors T301*b* and T301*c* are inactivated. Accordingly, the reference current source REF is connected to the drain of the current-voltage converting transistor T101L and the node N103 is connected to the drain of the current-voltage converting transistor T101R.

On the other hand, when the control signal R is at the H level and the control signal NR is at the L level, the switching transistors T301*a* and T301*d* are inactivated and the switching transistors T301*b* and T301*c* are activated. Accordingly, the reference current source REF is connected to the drain of the current-voltage converting transistor T101R and the node N103 is connected to the drain of the current-voltage converting transistor T101L.

<Timing of Switching>

The signal levels of the control signals R and NR are switched at arbitrary timings but are preferably switched regularly. For example, if the signal levels of the control signals R and NR are switched at every one frame, the timing of change of the current value of an output current $I_{out}$ coincides with the timing of switching of an image displayed on a display panel, so that a brightness change on the display panel becomes less conspicuous.

The switching of the signal levels of the control signals R and NR may be performed in a vertical blanking period.

In addition, if the signal levels of the control signals R and NR are switched such that a period in which all the switching transistors T301*a*, T301*b*, T301*c* and T301*d* are activated does not occur, stable switching operation is performed without occurrence of a short circuit between the reference current source REF and the node N103.

<Effects>

As described above, the locations of the current-voltage converting transistors T101R and T101L are replaced with each other according to the control signals R and NR, so that errors due to the characteristic difference between the transistors T101R and T101L are averaged. In this manner, errors in output currents $I_{out}$ output from the current driver to display element circuits are not inclined toward one direction, so that variation in light-emission luminance of the display panel is reduced.

In the display panel, the area for which the current value of an output current $I_{out}$ is switched is preferably small. For example, the current value of an output current $I_{out}$ is preferably switched for every one line. Then, a brightness change on the display panel is further suppressed.

EMBODIMENT 4

<Overall Configuration>

Figure 4:
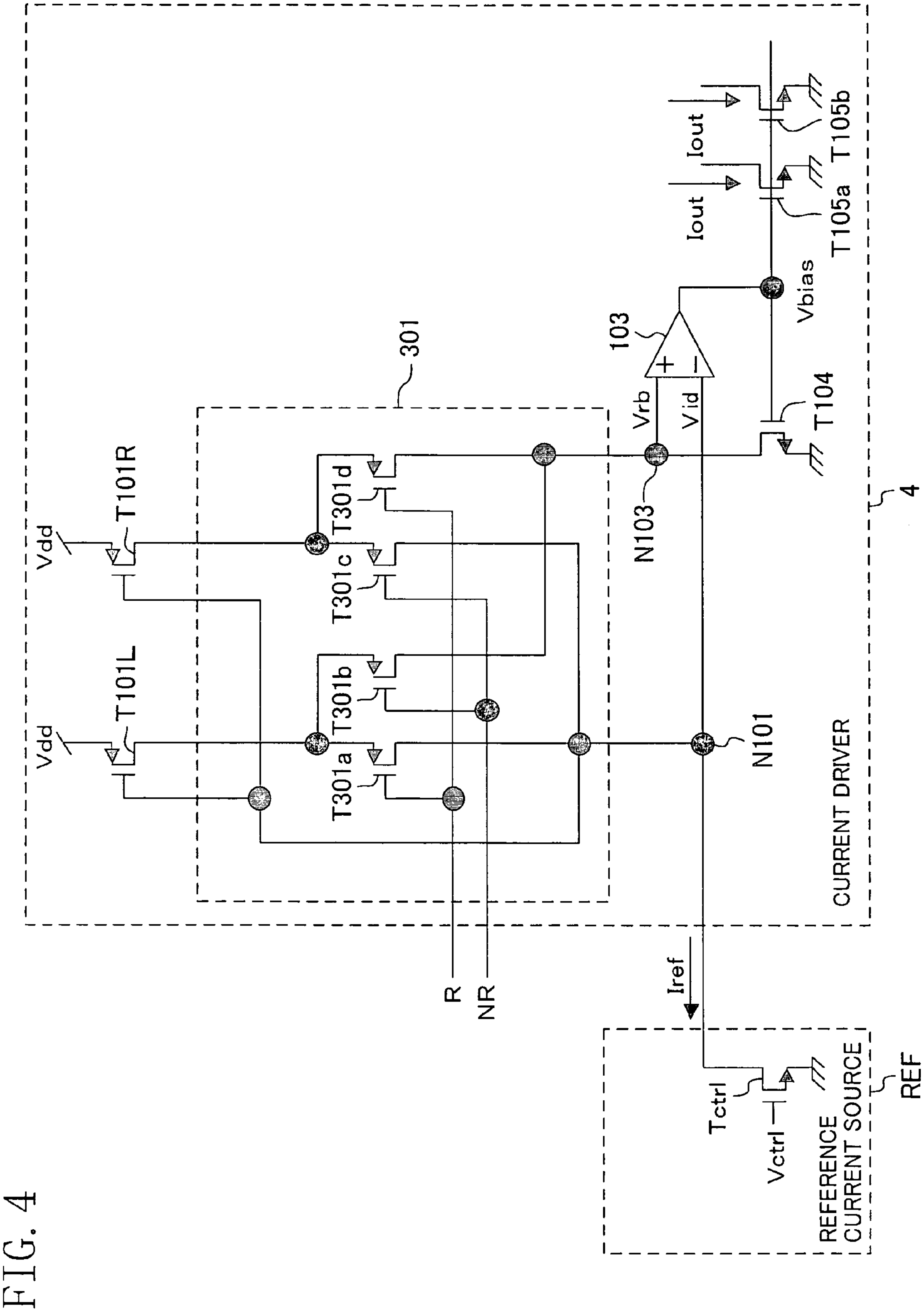
FIG. 4 is a view illustrating an overall configuration of a current driver according to a fourth embodiment of the present invention.

FIG. 4 illustrates an overall configuration of a current driver 4 according to a fourth embodiment of the present invention. The current driver 4 further includes the connection switching section 301 illustrated in FIG. 3, in addition to the components of the current driver 2 illustrated in FIG. 2. The other part of the configuration is the same as that illustrated in FIG. 2. The connection switching section 301 is provided between current-voltage converting transistors T101R and T101L and nodes N101 and N103. The connection switching section 301 connects one of the current-voltage converting transistors. T101R and T101L to the node N101 and the other to the node N103, according to control signals R and NR input from outside the driver.

In this embodiment, it is assumed that a current mirror formed by the current-voltage converting transistors T101R and T101L has a mirror ratio of "1:1".

<Operation>

Now, operation of the connection switching section illustrated in FIG. 4 will be described.

When the control signal R is at the L level (active) and the control signal NR is at the H level (inactive), the switching transistors T301*a* and T301*d* are activated and the switching transistors T301*b* and T301*c* are inactivated. Accordingly, the node N101 is connected to the drain of the current-voltage converting transistor T101L and the node N103 is connected to the drain of the current-voltage converting transistor T101R.

On the other hand, when the control signal R is at the H level and the control signal NR is at the L level, the switching transistors T301*a* and T301*d* are inactivated and the switching transistors T301*b* and T301*c* are activated. Accordingly, the node N101 is connected to the drain of the current-voltage converting transistor T101R and the node N103 is connected to the drain of the current-voltage converting transistor T101L.

<Effects>

As described above, the locations of the current-voltage converting transistors T101R and T101L are replaced with each other according to the control signals R and NR, so that errors due to the characteristic difference between the transistors T101R and T101L are averaged. Then, errors in output currents $I_{out}$ output from the current driver 4 to display element circuits are not inclined toward one direction, so that variation in light-emission luminance of a display panel is reduced.

EMBODIMENT 5

<Drain Voltage Dependence>

In general, a transistor during saturation operation is affected by drain voltage dependence (Early effect), and the current value of a drain current is slightly increased by a rise of a drain voltage. Accordingly, the drain voltage of a bias voltage generating transistor T104 is preferably equal to or approximately equal to the drain voltages of driving transistors T105*a* and T105*b*.

<Overall Configuration>

Figure 5:
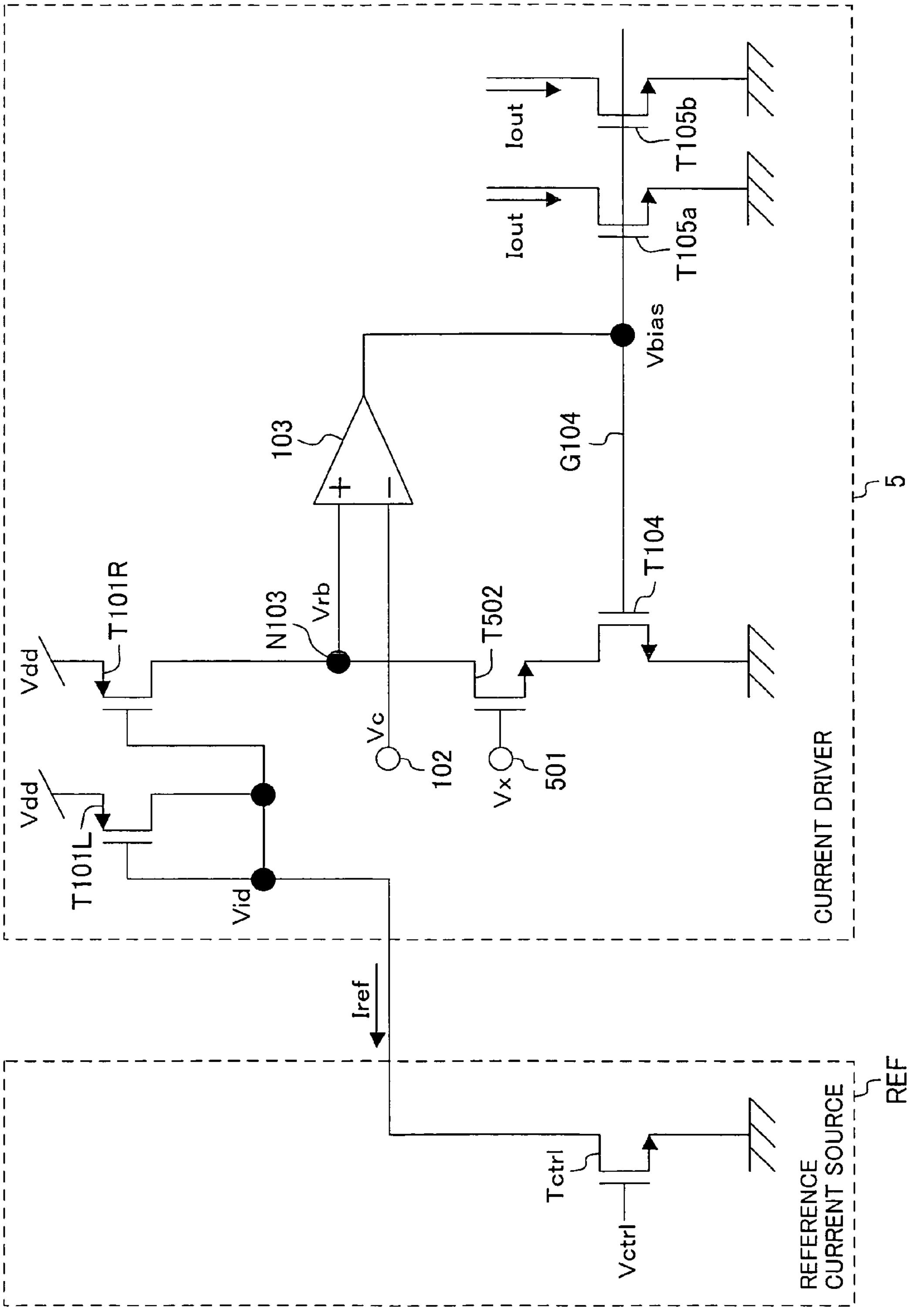
FIG. 5 is a view illustrating an overall configuration of a current driver according to a fifth embodiment of the present invention.

FIG. 5 illustrates an overall configuration of a current driver 5 according to a fifth embodiment of the present invention. The current driver 5 includes a clamping voltage supplying terminal 501 and a voltage clamping transistor T502, in addition to the components of the current driver 1 illustrated in FIG. 1. The other part of the configuration is the same as that illustrated in FIG. 1. The clamping voltage supplying terminal 501 supplies a clamping voltage $V_x$. The voltage clamping transistor T502 is provided between a node N103 and the bias voltage generating transistor T104 and receives, at its gate, the clamping voltage $V_x$ from the clamping voltage supplying terminal 501. The voltage clamping transistor T502 adjusts the drain voltage of the bias voltage generating transistor T104 according to the clamping voltage $V_x$ input to the gate thereof.

<Adjustment of Drain Voltage>

Now, it will be described how the drain voltage of the bias voltage generating transistor T104 is adjusted by the voltage clamping transistor T502 illustrated in FIG. 5.

When the average of the drain voltages of the driving transistors T105a and T105b is a "voltage $V_a$", the clamping voltage $V_x$ is set at a voltage obtained by adding the "threshold voltage $V_t$ of the voltage clamping transistor T502" to the "voltage $V_a$". In this manner, the source voltage of the voltage clamping transistor T502 (the drain voltage of the bias voltage generating transistor T104) is adjusted to a voltage approximately equal to the drain voltages of the driving transistors T105a and T105b.

<Effects>

As described above, the drain voltage of the bias voltage generating transistor T104 is adjusted to the drain voltages of the driving transistors T105a and T105b, so that errors due to drain voltage dependence in the driving transistors T105a and T105b are reduced.

EMBODIMENT 6

<Overall Configuration>

Figure 6:
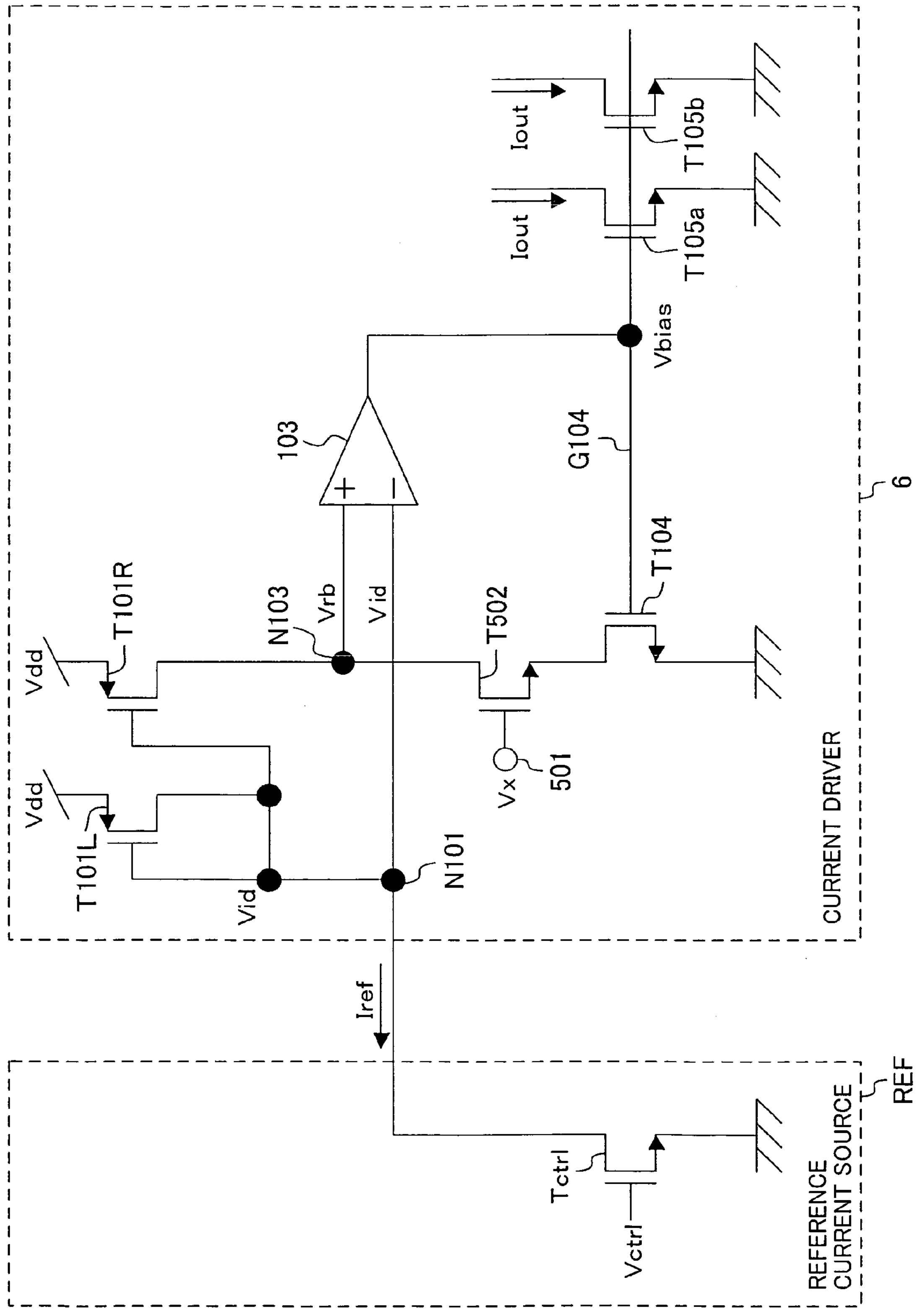
FIG. 6 is a view illustrating an overall configuration of a current driver according to a sixth embodiment of the present invention.

FIG. 6 illustrates an overall configuration of a current driver 6 according to a sixth embodiment of the present invention. The current driver 6 includes the clamping voltage supplying terminal 501 and the voltage clamping transistor T502 illustrated in FIG. 5, in addition to the components of the current driver 2 illustrated in FIG. 2. The other part of the configuration is the same as that illustrated in FIG. 2. The voltage clamping transistor T502 is provided between a node N103 and a bias voltage generating transistor T104 and receives, at its gate, a clamping voltage $V_x$ from the clamping voltage supplying terminal 501.

<Adjustment of Drain Voltage>

Operation of the voltage clamping transistor T502 illustrated in FIG. 6 is the same as that of the fifth embodiment (FIG. 5).

<Effects>

As described above, the drain voltage of the bias voltage generating transistor T104 is adjusted to the drain voltages of the driving transistors T105a and T105b, so that errors due to drain voltage dependence in the driving transistors T105a and T105b are reduced.

EMBODIMENT 7

<Overall Configuration>

Figure 7:
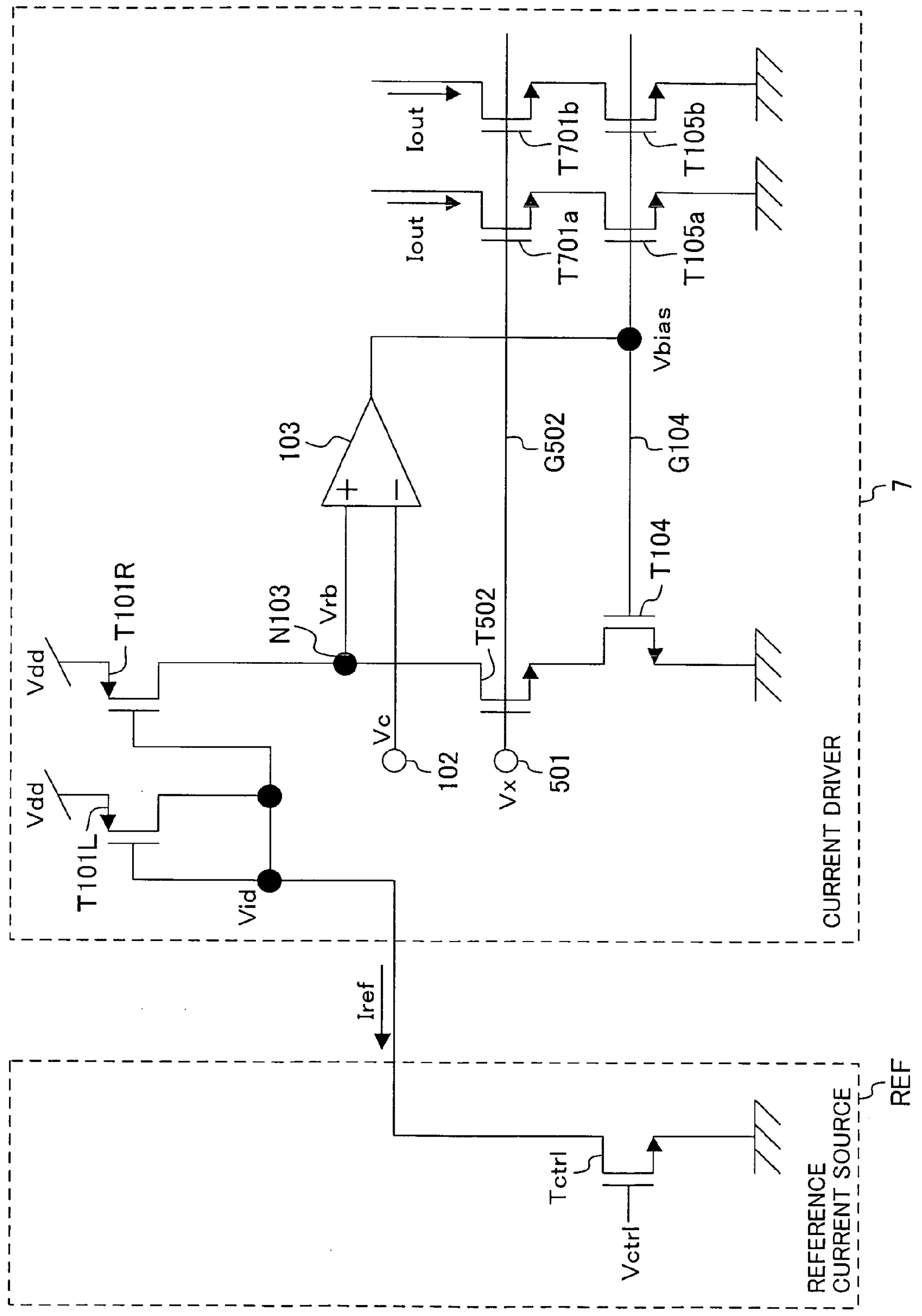
FIG. 7 is a view illustrating an overall configuration of a current driver according to a seventh embodiment of the present invention.

FIG. 7 illustrates an overall configuration of a current driver 7 according to a seventh embodiment of the present invention. The current driver 7 includes output voltage clamping transistors T701a and T701b in addition to the components of the current driver illustrated in FIG. 5. The other part of the configuration is the same as that illustrated in FIG. 5. A clamping voltage supplying terminal 501 supplies a clamping voltage $V_x$ to a gate line G502. The gate of a voltage clamping transistor T502 is connected to the gate line G502. The output voltage clamping transistor T701a is provided between a display element circuit (not shown) and a driving transistor T105a and has its gate connected to the gate line G502. The output voltage clamping transistor T701a adjusts the drain voltage of the driving transistor T105a according to the clamping voltage $V_x$ input to the gate of the output voltage clamping transistor T701a. The output voltage clamping transistor T701b is provided between a display element circuit (not shown) and a driving transistor T105b and has its gate connected to the gate line G502. The output voltage clamping transistor T701b adjusts the drain voltage of the driving transistor T105b according to the clamping voltage $V_x$ input to the gate of the output voltage clamping transistor T701b.

The I-V characteristic of each of the output voltage clamping transistors T701a and T701b is the same or substantially the same as that of the voltage clamping transistor T502.

<Adjustment of Drain Voltage>

Now, it will be described how the drain voltages of the bias voltage generating transistor T104 and the driving transistors T105a and T105b are adjusted by the voltage clamping transistor T502 and the output voltage clamping transistors T701a and T701b illustrated in FIG. 7.

For example, to set the drain voltages of the driving transistors T105a and T105b at a "voltage $V_a$", the clamping voltage $V_x$ is set at a voltage obtained by adding the "threshold voltage $V_t$ of the voltage clamping transistor T502" to the "voltage $V_a$". In this manner, the source voltage of the voltage clamping transistor T502 (the drain voltage of the bias voltage generating transistor T104) and the source voltages of the output voltage clamping transistors T701a and T701b (the drain voltages of the driving transistors T105a and T105b) are adjusted to the "voltage $V_a$".

<Effects>

As described above, the drain voltage of the bias voltage generating transistor T104 is adjusted to a voltage approximately equal to the drain voltages of the driving transistors T105a and T105b, so that errors due to drain voltage dependence in the driving transistors T105a and T105b are reduced.

EMBODIMENT 8

<Overall Configuration>

Figure 8:
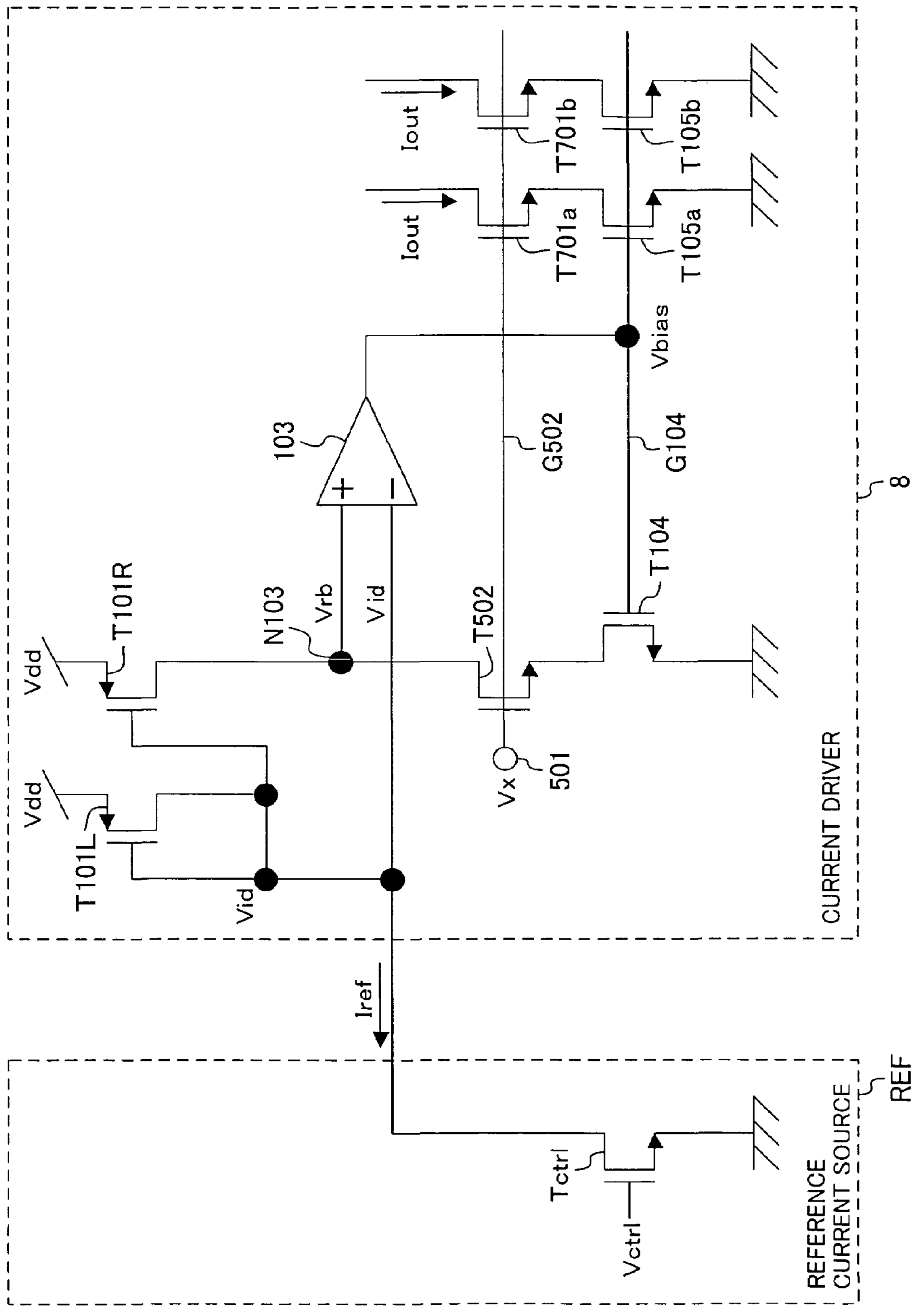
FIG. 8 is a view illustrating an overall configuration of a current driver according to an eighth embodiment of the present invention.

FIG. 8 illustrates an overall configuration of a current driver 8 according to an eighth embodiment of the present invention. The current driver 8 includes the output voltage clamping transistors T701a and T701b illustrated in FIG. 7, in addition to the components of the current driver 6 illustrated in FIG. 6. The other part of the configuration is the same as that illustrated in FIG. 6.

<Adjustment of Drain Voltage>

Operation of a voltage clamping transistor T502 and the output voltage clamping transistors T701a and T701b illustrated in FIG. 8 is the same as that of the seventh embodiment (FIG. 7).

<Effects>

As described above, the drain voltage of a bias voltage generating transistor T104 is adjusted to a voltage approximately equal to the drain voltages of driving transistors T105*a* and T105*b*, so that errors due to drain voltage dependence in the driving transistors T105*a* and T105*b* are reduced.

EMBODIMENT 9

<Overall Configuration>

Figure 9:
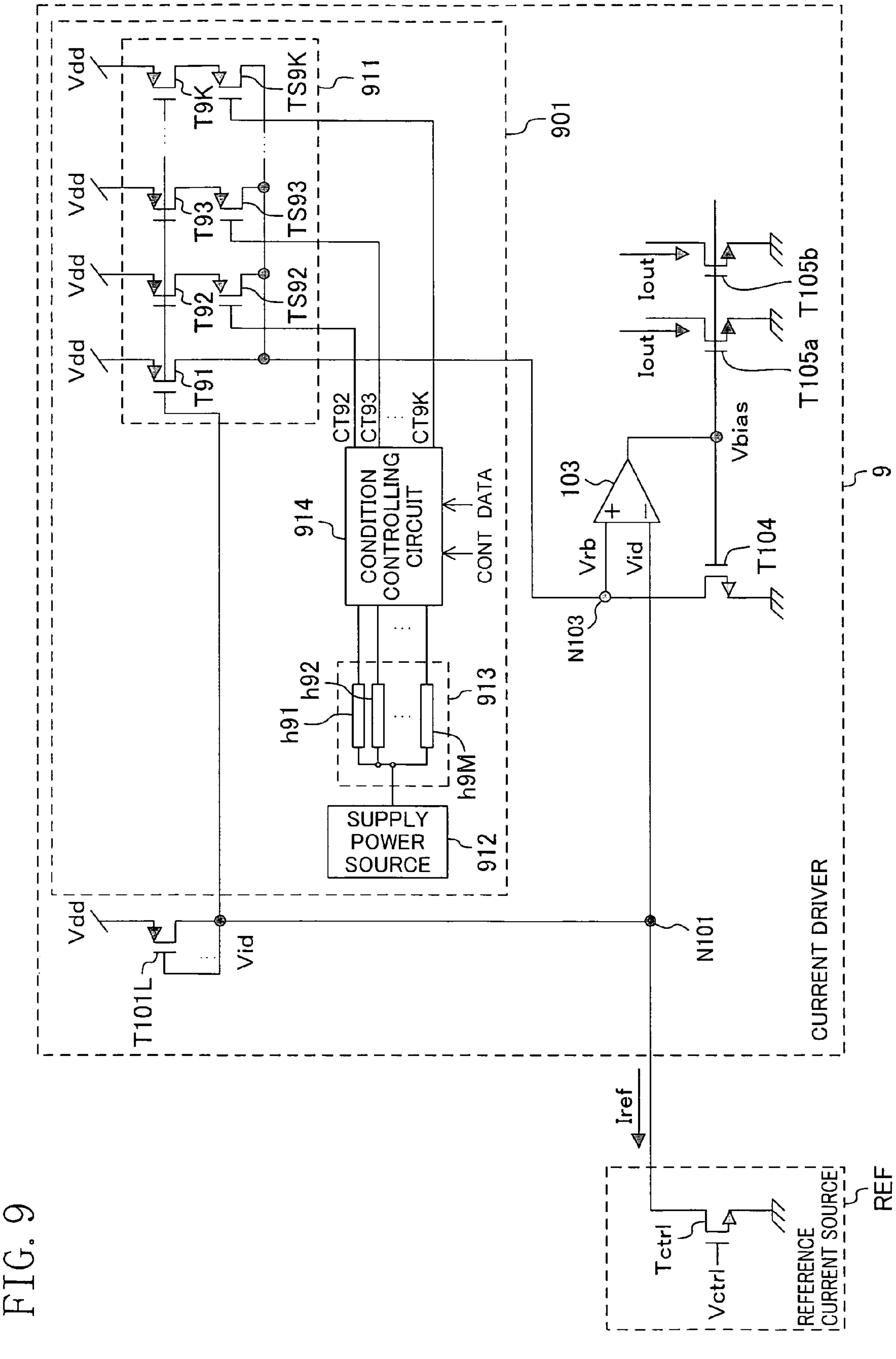
FIG. 9 is a view illustrating an overall configuration of a current driver according to a ninth embodiment of the present invention.

FIG. 9 illustrates an overall configuration of a current driver 9 according to a ninth embodiment of the present invention. The current driver 9 includes a bias voltage adjusting section 901, instead of the current-voltage converting transistor T101R illustrated in FIG. 2. The other part of the configuration is the same as that illustrated in FIG. 2. The bias voltage adjusting section 901 is connected between an internal power supply node Vdd and a node N103 and receives a gate voltage $V_{id}$ generated at the gate of a current-voltage converting transistor T101L. The bias voltage adjusting section 901 has a resistance value according to the voltage value of the gate voltage $V_{id}$ supplied from the current-voltage converting transistor T101L. The relationship between the voltage value of the gate voltage $V_{id}$ and the resistance value of the bias voltage adjusting section 901 according to the voltage value of the gate voltage can be arbitrarily set.

<Internal Configuration of Bias Voltage Adjusting Section 901>

The bias voltage adjusting section 901 includes: a current-voltage converting unit 911; a supply power source 912, a condition storing unit 913; and a condition controlling circuit 914.

The current-voltage converting unit 911 includes: K current-voltage converting transistors T91 through T9K; and (K−1) selecting transistors TS92 through TS9K. The current-voltage converting transistor T91 is provided between an internal power supply node Vdd and the node N103 and has its gate connected to the gate of the current-voltage converting transistor T101L. The current-voltage converting transistors T92 through T9K are associated with the selecting transistors TS92 through TS9K in a one-to-one relationship. Each of the current-voltage converting transistors T92 through T9K and an associated one of the selecting transistors TS92 through TS9K are connected in series between an internal power supply node Vdd and the node N103. The current-voltage converting transistors T92 through T9K are provided between the internal power supply nodes Vdd and the selecting transistors TS92 through TS9K and have their gates connected to the gate of the current-voltage converting transistor T101L. The selecting transistors TS92 through TS9K are provided between the current-voltage converting transistors T92 through T9K and the node N103 and receive, at their gates, control signals CT92 through CT9K, respectively, from the condition controlling circuit 914.

When the control signals CT92 through CT9K are at the L level, these signals are voltages for activating the selecting transistors TS92 through TS9K (pMOS transistors) whereas when the control signals CT92 through CT9K are at the H level, these signals are voltages for inactivating the selecting transistors TS92 through TS9K.

In the current-voltage converting unit 911, the drains of the current-voltage converting transistors T91 through T9K are arbitrarily connected to the node N103 using the selecting transistors TS92 through TS9K, so that the relationship between the voltage value of a gate voltage $V_{id}$ and the resistance value of the current-voltage converting unit 911 is arbitrarily set.

The supply power source 912 supplies a read-out voltage to the condition controlling circuit 914 and the condition storing unit 913. The read-out voltage is a voltage for determining the connection state in the condition storing unit 913.

The condition storing unit 913 includes M fuses h91 through h9M. Each of the fuses h91 through h9M is made of a material capable of changing from conducting to nonconducting when being blown by application of a laser or a large current. The condition storing unit 913 stores binary data of M bits by expressing the states (i.e., blown or not blown) of the fuses h92 through h9M in binary numbers. In this embodiment, it is assumed that the condition storing unit 913 stores binary data representing the number of transistors to be used out of the current-voltage converting transistors T92 through T9K. For example, when the fuse h91 is blown and the other fuses h92 through h9M are not blown, the condition storing unit 913 stores data showing that the number of transistors to be used is "one". On the other hand, when the fuses h91 and h92 are blown and the other fuses h93 through h9M are not blown, the condition storing unit 913 stores data showing that the number of transistors to be used is "three".

The condition controlling circuit 914 enters a condition fixing mode or an emulating mode according to a control signal CONT input from outside the circuit.

In the condition fixing mode, the condition controlling circuit 914 connects one terminal of each of the fuses h92 through h9M included in the condition storing unit 913 to the condition controlling circuit 914 itself so as to read voltage levels represented by the fuses h91 through h9M. In this manner, binary data expressed by the states (i.e., blown or not blown) of the fuses is read out. The condition controlling circuit 914 outputs control signals CT92 through CT9K by decoding the binary data that has been read out. For example, when the fuses h91 and h92 are blown in the condition storing unit 913 (i.e., when binary data showing that the number of transistors to be used is "three" is stored in the condition storing unit 913), the voltage levels represented by the fuses h91 through h9M are "L, L, H, . . . , H". In this case, the condition controlling circuit 914 sets the control signals CT92 through CT94 at the L level and the other control signals CT95 through CT9K at the H level.

In the emulating mode, the condition controlling circuit 914 emulates the states (i.e., blown or not blown) of the fuses h91 through h9M in the condition storing unit 913 according to a data signal DATA input from outside the circuit, and outputs control signals CT92 through CT9K. The data signal DATA is a signal for emulating the states (i.e., blown or not blown) of the fuses in the condition storing unit 913 and shows M voltage levels according to the states (i.e., blown or not blown) of the fuses. For example, in the case of a data signal DATA for emulating a state in which the fuse h91 is blown, the M voltage levels shown by this data signal DATA are "L, H, H, . . . , H". In this case, the condition controlling circuit 914 sets the control signal CT92 at the L level and the other control signals CT93 through CT9K at the H level. On the other hand, in the case of a data signal DATA for emulating a state in which the fuses h91 and h92 are blown, the M voltage levels shown by this data signal DATA are "H, L, H, . . . , H". In this case, the condition controlling circuit 914 sets the control signals CT92 and CT93 at the L level and the other control signals CT94 through CT9K at the H level.

<Operation>

Now, operation of the bias voltage adjusting section 901 illustrated in FIG. 9 will be described.

[Condition Fixing Mode]

The condition controlling circuit 914 enters a condition fixing mode when receiving a control signal CONT requiring switching to the condition fixing mode.

Then, the condition controlling circuit 914 connects one terminal of each of the fuses h91 through h9M included in the condition storing unit 913 to the condition controlling circuit 914 itself, and reads binary data represented by the states (i.e., blown or not blown) of the fuses.

Thereafter, the condition controlling circuit 914 decodes the binary data that has been read out and outputs control signals CT92 through CT9K to the gates of the respective selecting transistors TS92 through TS9K.

When the fuse h91 is blown, the condition controlling circuit 914 sets the control signal CT92 at the L level and the other control signals CT93 through CT9K at the H level. Accordingly, the selecting transistor TS92 is activated and the current-voltage converting transistor T92 is connected to the node N103, so that the current-voltage converting transistors T91 and T92 are connected to the node N103. Accordingly, a drain current ($I_{91}+I_{92}$) that is the sum of a drain current $I_{91}$ determined by the current mirror ratio between the current-voltage converting transistor T101L and the current-voltage converting transistors T91 and a drain current $I_{92}$ determined by the current mirror ratio between the current-voltage converting transistor T101L and the current-voltage converting transistors T92 flows in a bias voltage generating transistor T104. This makes a bias voltage $V_{bias}$ applied to the gate of the bias voltage generating transistor T104 set at a voltage value associated with the current value of the drain current ($I_{91}+I_{92}$).

In this manner, binary data stored in the condition storing unit 913 is decoded, so that the output states of the control signals CT92 through CT9K are reproduced. In addition, these output states are maintained.

[Emulating Mode]

On the other hand, the condition controlling circuit 914 enters an emulating mode when receiving a control signal CONT requiring switching to the emulating mode.

Then, the condition controlling circuit 914 outputs control signals CT92 through CT9K according to a data signal DATA.

In this case, suppose the data signal DATA shows that "none of the fuses h92 through h9M is blown". Then, all the control signals CT92 through CT9K output from the condition controlling circuit 914 are at the H level (inactive). Accordingly, none of the selecting transistors TS92 through TS9K is activated and none of the current-voltage converting transistors T92 through T9K is connected to the node N103, so that only the current-voltage converting transistors T91 is connected to the node N103. Therefore, the drain current $I_{91}$ determined by the current mirror ratio between the current-voltage converting transistor T101L and the current-voltage converting transistors T91 flows in the bias voltage generating transistor T104. Then, a bias voltage $V_{bias}$ associated with the current value of the drain current $I_{91}$ is output from the output terminal of a differential amplifier 103.

In this manner, the states (i.e., blown or not blown) of the fuses h91 through h9M in the condition storing unit 913 are emulated according to the data signal DATA, so that the resistance value of the bias voltage adjusting section 901 is set at an arbitrary value. This enables adjustment of the current value of a drain current $I_d$ flowing in the bias voltage generating transistor T104.

<Effects>

As described above, the performance of the current-voltage converting unit 911 is adjusted by the condition controlling circuit 914, so that the current driver is allowed to operate under conditions (optimum conditions) in which the states of output currents $I_{out}$ in the driving transistors T105*a* and T105*b* are optimized.

In addition, if the output states of the control signals CT92 through CT9K are stored by blowing the fuses h91 through h9M included in the condition storing unit 913 based on the emulation result, the conditions when output currents $I_{out}$ are in optimum states are maintained.

Moreover, the use of the current-voltage converting transistors T92 through T9K as output-side transistors of current mirrors enables reduction of the influence of variations among transistors.

In this embodiment, the condition storing unit 913 including a plurality of fuses is used to store the number (the output states of the control signals CT92 through CT9K) of transistors to be selected from the current-voltage converting transistors T91 through T9K by the condition controlling circuit 914. Alternatively, the current driver may have a configuration in which data representing the output states of the control signals CT92 through CT9K is stored in a storage medium such as a DRAM or an SRAM and is decoded so as to output the control signals CT92 through CT9K.

Alternatively, the condition controlling circuit 914 may operate using the condition fixing mode as a default. That is, the condition controlling circuit 914 may be always in the condition fixing mode except for the emulating mode.

Alternatively, to reduce the number of fuses to be blown, a setting with which the number of fuses to be blown increases based on conditions when output currents $I_{out}$ are in optimum states may be used. For example, suppose the output currents $I_{out}$ are in optimum states when two of the current-voltage converting transistors T91 through T9K are used, the condition controlling circuit 914 decodes binary data stored in the condition storing unit 913 such that the control signals CT92 and CT93 are at the L level and the other control signals CT94 through CT9K are at the H level when the voltage levels represented by the fuses h91 through h9M are "H, H, H, . . . , H".

EMBODIMENT 10

<Overall Configuration>

Figure 10:
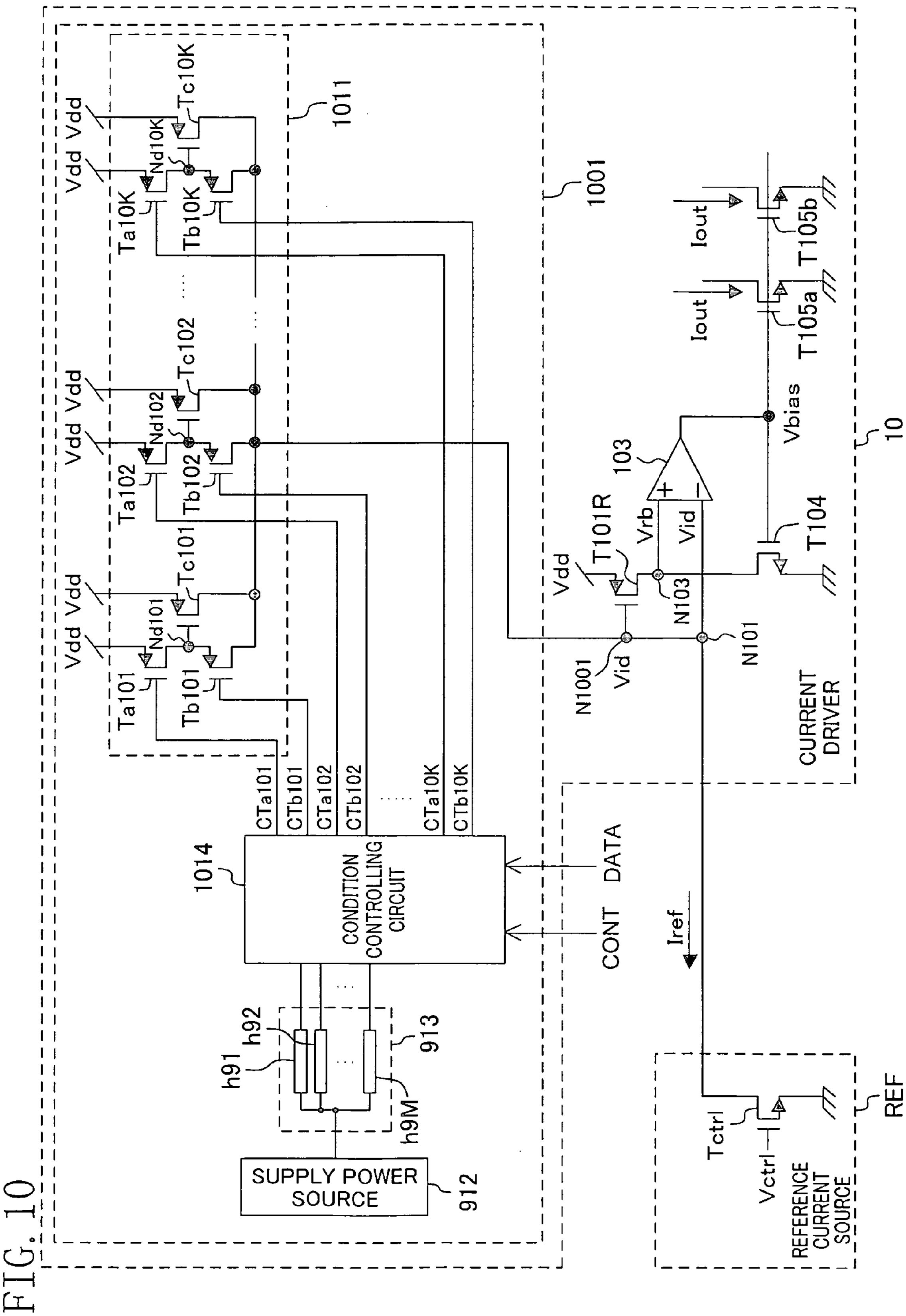
FIG. 10 is a view illustrating an overall configuration of a current driver according to a tenth embodiment of the present invention.

FIG. 10 illustrates an overall configuration of a current driver 10 according to a tenth embodiment of the present invention. The current driver 10 includes a gate voltage adjusting section 1001, instead of the current-voltage converting transistor T101L illustrated in FIG. 2. The other part of the configuration is the same as that illustrated in FIG. 2. The gate voltage adjusting section 1001 generates a gate voltage having a voltage value according to the current value of a reference current $I_{ref}$. The relationship between the current value of the reference current $I_{ref}$ and the voltage value of a gate voltage $V_{id}$ generated by the gate voltage adjusting section 1001 according to the current value of the reference current $I_{ref}$ can be arbitrarily set.

<Internal Configuration of Gate Voltage Adjusting Section 1001>

The gate voltage adjusting section 1001 includes: a current-voltage converting unit 1011; a supply power source 912; a condition storing unit 913; and a condition controlling circuit 1014.

The current-voltage converting unit 1011 includes: K selecting transistors Ta101 through Ta10K; K selecting transistors Tb101 through Tb10K; and K current-voltage converting transistors Tc101 through Tc10K. Each of the selecting transistors Ta101 through Ta10K and an associated one of the selecting transistors Tb101 through Tb10K are provided in series between an internal power supply node Vdd and a node N1001. The selecting transistors Ta101 through Ta10K are provided between the internal power supply nodes Vdd and nodes Nd101 through Nd10K and receive, at their gates, respective control signals CTa101 through CTa10K from the condition controlling circuit 1014. The selecting transistors Tb101 through Tb10K are provided between the node N1001 and the nodes Nd101 through Nd10K and receive, at their gates, respective control signals CTb101 through CTb10K from the condition controlling circuit 1014. The current-voltage converting transistors Tc101 through Tc10K are provided between the internal power supply nodes Vdd and the node N1001, and have their gates connected to the respective nodes Nd101 through Nd10K. The node N1001 is connected to the gate of a current-voltage converting transistor T101R and a node N101.

When the control signals CTa101 through CTa10K and CTb101 through CTb10K are at the L level, these signals are voltages for activating the selecting transistors Ta101 through Ta10K and Tb101 through Tb10K (pMOS transistors), whereas when the control signals CTa101 through CTa10K and CTb101 through CTb10K are at the H level, these signals are voltages for inactivating the selecting transistors Ta101 through Ta10K and Tb101 through Tb10K.

In the current-voltage converting unit 1011, the drains and gates of the current-voltage converting transistors Tc101 through Tc10K are arbitrarily connected to the node N1001 using the selecting transistors Ta101 through Ta10K and Tb101 through Tb10K, so that the relationship between the current value of the reference current $I_{ref}$ and the voltage value of the gate voltage $V_{id}$ generated by the current-voltage converting unit 1011 is arbitrarily set.

The supply power source 912 is the same as that illustrated in FIG. 9.

The condition storing unit 913 is the same as that illustrated in FIG. 9. In this embodiment, it is assumed that the condition storing unit 913 stores binary data showing the number of transistors to be used out of the current-voltage converting transistors Tc101 through Tc10K. For example, when a fuse h91 is blown and the other fuses h92 through h9M are not blown, the condition storing unit 913 stores data showing that the number of transistors to be used is "one". On the other hand, when the fuses h91 and h92 are blown and the other fuses h93 through h9M are not blown, the condition storing unit 913 stores data showing that the number of transistors to be used is "three".

As the condition controlling circuit 914, the condition controlling circuit 1014 enters a condition fixing mode or an emulating mode according to a control signal CONT input from outside the circuit.

In the condition fixing mode, as the condition controlling circuit 914, the condition controlling circuit 1014 decodes binary data stored in the condition storing unit 913, thereby outputting control signals CTa101 through CTa10K and CTb101 through CTb10K. For example, when the fuse 91*h* is blown in the condition storing unit 913, the condition controlling circuit 1014 sets the control signal CTa101 at the H level, the control signals CTa102 through CTa10K at the L level, the control signal CTb101 at the L level, and the control signals CTb102 through CTb10K at the H level.

In the emulating mode, as the condition controlling circuit 914, the condition controlling circuit 1014 emulates the states (i.e., blown or not blown) of the fuses h91 through h9M in the condition storing unit 913 according to a data signal DATA input from outside the circuit, thereby outputting control signals CTa101 through CTa10K and CTb101 through CTb10K. For example, in the case of a data signal DATA for emulating a state in which the fuses h91 and h92 are blown, M voltage levels shown by this data signal DATA are "H, L, H, . . . , H". In this case, the condition controlling circuit 1014 sets the control signals CTa101 and CTa102 at the H level, the control signals CTa103 through CTa10K at the L level, the control signals CTb101 and CTb102 at the L level, and the control signals CTb103 through CTb10K at the H level.

<Operation>

Now, operation of the gate voltage adjusting section 1001 illustrated in FIG. 10 will be described.

[Condition Fixing Mode]

The condition controlling circuit 1014 enters a condition fixing mode when receiving a control signal CONT requiring switching to the condition fixing mode. Then, the condition controlling circuit 1014 connects one terminal of each of the fuses h91 through h9M included in the condition storing unit 913 to the condition controlling circuit 1014 itself, and reads binary data represented by the states (i.e., blown or not blown) of the fuses. Thereafter, the condition controlling circuit 1014 decodes the binary data that has been read out and outputs control signals CTa101 through CTa10K and CTb101 through CTb10K to the gates of the respective selecting transistors Ta101 through Ta10K and Tb101 through Tb10K.

When the fuse h91 is blown, the condition controlling circuit 1014 sets the control signals CTb101 and CTa102 through CTa10K at the L level (active) and the other control signals CTa101 and CTb102 through CTb10K at the H level (inactive). Accordingly, the selecting transistor Ta101 is not activated and the selecting transistor Tb101 is activated, so that the gate and drain of the current-voltage converting transistor Tc101 have the same potential and a current flows. On the other hand, the selecting transistors Ta102 through Ta10K are activated and the selecting transistors Tb102 through Tb10K are not activated, so that the gates of the current-voltage converting transistors Tc102 through Tc10K have the same potential as the internal power supply nodes Vdd and no currents flow. Accordingly, a reference current $I_{ref}$ flows only in the current-voltage converting transistor Tc101. In this manner, a gate voltage $V_{id}$ generated at the gate of the current-voltage converting transistor Tc101 is input to the gate of the current-voltage converting transistor T101R.

In this manner, the output states of the control signals CTa101 through CTa10K and CTb101 through CTb10K stored in the condition storing unit 913 are reproduced. In addition, these output states are maintained.

[Emulating Mode]

On the other hand, the condition controlling circuit 1014 enters an emulating mode when receiving a control signal CONT requiring switching to the emulating mode. Then, the condition controlling circuit 1014 outputs control signals CTa101 through CTa10K and CTb101 through CTb10K according to a data signal DATA.

In this case, when a data signal DATA for emulating a state in which the fuses h91 and h92 are blown is input to the condition controlling circuit 1014, the condition controlling circuit 1014 sets the control signals CTb101, CTb102 and CTa103 through CTa10K at the L level (active) and the control signals CTa101, CTa102 and CTb103 through CTb10K at the H level (inactive). Accordingly, the selecting transistors Ta101 and Ta102 are not activated and the selecting transistor Tb101 is activated, so that the gate and drain of the current-voltage converting transistor Tc101 have the same potential and a current flows. Since the selecting transistor Ta102 is not activated and the selecting transistor Tb102 is activated, the gate and drain of the current-voltage converting transistor Tc102 have the same potential and a current flows. On the other hand, the selecting transistors Ta103 through Ta10K are activated and the selecting transistors Tb103 through Tb10K are not activated, so that the gates of the current-voltage converting transistors Tc103 through Tc10K have the same potential as the internal power supply nodes Vdd and no currents flow. Accordingly, the reference current $I_{ref}$ flows only in the current-voltage converting transistors Tc101 and Tc102. In this manner, a gate voltage $V_{id}$ generated at the gate of the current-voltage converting transistor Tc101 and a gate voltage $V_{id}$ generated at the gate of the current-voltage converting transistor Tc102 are input to the gate of the current-voltage converting transistor T101R.

In this manner, the states (i.e., blown or not blown) of the fuses h91 through h9M in the condition storing unit 913 are emulated according to the data signal DATA, so that the voltage value of the gate voltage $V_{id}$ input to the current-voltage converting transistor T101R is adjusted.

<Effects>

As described above, the performance of the current-voltage converting unit 1011 is adjusted by the condition controlling circuit 1014, so that the current driver is allowed to operate under conditions (optimum conditions) in which the states of output currents $I_{out}$ in driving transistors T105*a* and T105*b* are optimized.

In addition, if the output states of the control signals CTa101 through CTa10K and CTb101 through CTb10K are stored by blowing the fuses h91 through h9M included in the condition storing unit 913 based on the emulation result, the conditions when output currents $I_{out}$ are in optimum states are maintained.

EMBODIMENT 11

<Overall Configuration>

Figure 11:
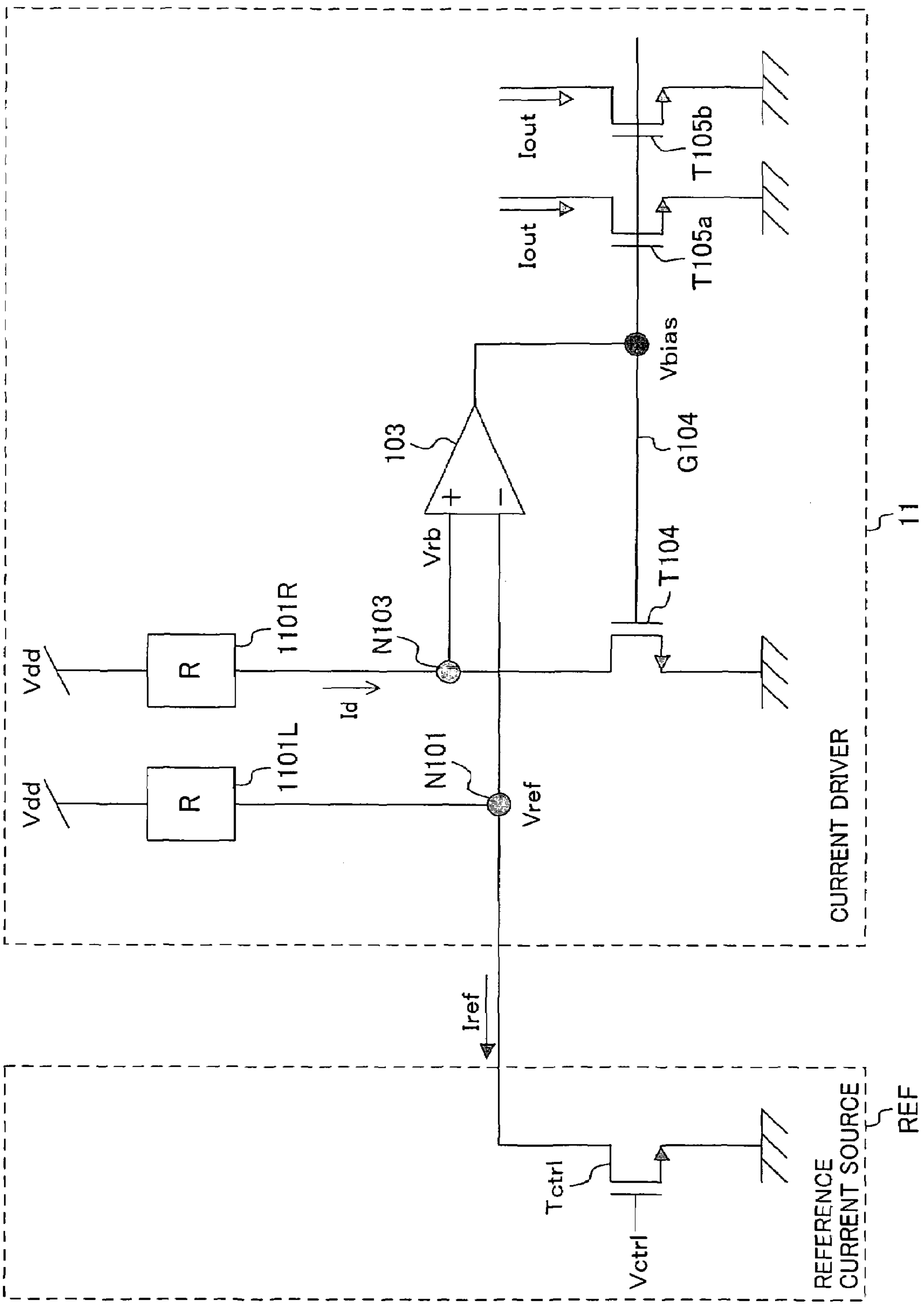
FIG. 11 is a view illustrating an overall configuration of a current driver according to an eleventh embodiment of the present invention.

FIG. 11 illustrates an overall configuration of a current driver 11 according to an eleventh embodiment of the present invention. The current driver 11 includes current-voltage conversion resistances 1101R and 1101L, instead of the current-voltage converting transistors T101R and T101L illustrated in FIG. 2. The other part of the configuration is the same as that illustrated in FIG. 2.

The current-voltage conversion resistance 1101L is connected between an internal power supply node Vdd and a node N101. Accordingly, a reference voltage $V_{ref}$ having a voltage value according to the current value of a reference current $I_{ref}$ and the resistance value of the current-voltage conversion resistance 1101L is generated at the node N101.

The current-voltage conversion resistance 1101R is provided between an internal power supply node Vdd and a node N103 and connected in series with a bias voltage generating transistor T104. A drain current $I_d$ according to the resistance value of the current-voltage conversion resistance 1101R and the resistance value of channel resistance of the bias voltage generating transistor T104 flows in the current-voltage conversion resistance 1101R and the bias voltage generating transistor T104. A comparative voltage $V_{rb}$ having a voltage value according to a voltage drop in the current-voltage conversion resistance 1101R is generated at the node N103.

A differential amplifier 103 receives the comparative voltage $V_{rb}$ generated at the node N103 at its non-inverting input terminal and receives the reference voltage $V_{ref}$ generated by the current-voltage conversion resistance 1101L at its inverting input terminal. The differential amplifier 103 outputs a bias voltage $V_{bias}$ having a voltage value according to the difference between the voltage value of the received comparative voltage $V_{rb}$ and the voltage value of the reference voltage $V_{ref}$.

<Operation>

Now, operation of the current driver 11 illustrated in FIG. 11 will be described.

First, a reference current $I_{ref}$ flows in the current-voltage conversion resistance 1101L connected to a reference current source REF. A voltage drop according to the current value of the reference current $I_{ref}$ and the resistance value of the current-voltage conversion resistance 1101L occurs in the current-voltage conversion resistance 1101L, so that a reference voltage $V_{ref}$ is generated at the node N101 according to this voltage drop.

On the other hand, the drain current $I_d$ flowing in the bias voltage generating transistor T104 flows in the current-voltage conversion resistance 1101R. A voltage drop occurs according to the current value of the drain current $I_d$ and the resistance value of the current-voltage conversion resistance 1101R, so that a comparative voltage $V_{rb}$ is generated at the node N103 according to this voltage drop.

Then, the differential amplifier 103 outputs, to a gate line G104, a bias voltage $V_{bias}$ having a voltage value according to the comparative voltage $V_{rb}$ received at its non-inverting input terminal and the reference voltage $V_{ref}$ received at its inverting input terminal. The bias voltage $V_{bias}$ input to the gate line G104 is input to the gate of the bias voltage generating transistor T104 and the gates of driving transistors T105*a* and T105*b*.

Thereafter, in each of the driving transistors T105*a* and T105*b*, an output current $I_{out}$ according to the voltage value of the bias voltage $V_{bias}$ input to the gate thereof flows. Accordingly, output currents $I_{out}$ flow in display element circuits (not shown).

On the other hand, the resistance value of channel resistance of the bias voltage generating transistor T104 varies depending on the voltage value of the bias voltage $V_{bias}$ applied to the gate of the bias voltage generating transistor T104, so that the current value of the drain current $I_d$ flowing in the bias voltage generating transistor T104 (and the current-voltage conversion resistance 1101R) varies depending on the voltage value of the bias voltage $V_{bias}$ input to the gate of the bias voltage generating transistor T104. The variation of the channel resistance value of the bias voltage generating transistor T104 causes the voltage value of the comparative voltage $V_{rb}$ generated at the node N103 to vary. The variation of the current value of the drain current $I_d$ causes the degree of the voltage drop in the current-voltage conversion resistance 1101R to vary, so that the voltage value of the comparative voltage $V_{rb}$ generated at the node N103 also varies.

[The Case of (Current Value of Drain Current $I_d$)<(Current Value of Reference Current $I_{ref}$)]

Now, a case where the current value of the drain current $I_d$ flowing in the current-voltage conversion resistance 1101R is smaller than that of the reference current $I_{ref}$ flowing in the current-voltage conversion resistance 1101L will be described.

In this case, the voltage drop in the current-voltage conversion resistance 1101R is smaller than in a case where the current value of the drain current $I_d$ is equal to that of the reference current $I_{ref}$, so that the voltage value of the comparative voltage $V_{rb}$ generated at the node N103 is larger than that of the reference voltage $V_{ref}$ generated at the node N101. Accordingly, the voltage value of the bias voltage $V_{bias}$ output from the differential amplifier 103 is larger than that of the bias voltage $V_{bias}$ output in a case where the comparative voltage $V_{rb}$ and the reference voltage $V_{ref}$ are equal to each other. This reduces the resistance value of channel resistance of the bias voltage generating transistor T104. As a result, the current value of the drain current $I_d$ flowing in the current-voltage conversion resistance 1101R and the bias voltage generating transistor T104 increases. The increase of the current value of the drain current $I_d$ increases the degree of the voltage drop in the current-voltage conversion resistance 1101R, so that the voltage value of the comparative voltage $V_{rb}$ generated at the node N103 decreases.

[The Case of (Current Value of Drain Current $I_d$)>(Current Value of Reference Current $I_{ref}$)]

Now, a case where the current value of the drain current $I_d$ flowing in the current-voltage conversion resistance 1101R is larger than that of the reference current $I_{ref}$ flowing in the current-voltage conversion resistance 1101L will be described.

In this case, the voltage drop in the current-voltage conversion resistance 1101R is larger than in a case where the current value of the drain current $I_d$ is equal to that of the reference current $I_{ref}$, so that the voltage value of the comparative voltage $V_{rb}$ generated at the node N103 is smaller than that of the reference voltage $V_{ref}$ generated at the node N101. Accordingly, the voltage value of the bias voltage $V_{bias}$ output from the differential amplifier 103 is smaller than that of the bias voltage $V_{bias}$ output in a case where the comparative voltage $V_{rb}$ and the reference voltage $V_{ref}$ are equal to each other. This increases the resistance value of channel resistance of the bias voltage generating transistor T104. As a result, the current value of the drain current $I_d$ flowing in the current-voltage conversion resistance 1101R and the bias voltage generating transistor T104 decreases. The decrease of the current value of the drain current $I_d$ reduces the degree of the voltage drop in the current-voltage conversion resistance 1101R, so that the voltage value of the comparative voltage $V_{rb}$ generated at the node N103 increases.

In this manner, the increase/decrease of the resistance value of channel resistance of the bias voltage generating transistor T104 makes the current value of the drain current $I_d$ closer to the current value of the reference current $I_{ref}$.

To make the current value of an output current $I_{out}$ twice as large as that of the reference current $I_{ref}$, it is sufficient to make the resistance value of the current-voltage conversion resistance 1101R half of the resistance value of the current-voltage conversion resistance 1101L. In this case, when the current value of the drain current $I_d$ flowing in the current-voltage conversion resistance 1101R and the bias voltage generating transistor T104 doubles, the voltage value of the comparative voltage $V_{rb}$ generated at the node N103 and the voltage value of the reference voltage $V_{ref}$ become equal to each other. Even when the mirror ratio of the current mirror formed by the bias voltage generating transistor T104 and each of the driving transistors T105*a* and T105*b* is set at "1:2", the current value of the output current $I_{out}$ is twice as large as that of the reference current $I_{ref}$ in the same manner.

<Effects>

As described above, each of the driving transistors T105*a* and T105*b* generates an output current $I_{out}$ according to a bias voltage $V_{bias}$ output from the differential amplifier 103. The differential amplifier 103 has low output impedance, so that a voltage drop occurring in the differential amplifier 103 is small. Accordingly, electric power is used more effectively than in conventional current drivers.

The differential amplifier 103 has high input impedance, so that small electric loads are placed on the current-voltage conversion resistances 1101R and 1101L.

The current driver 11 of this embodiment receives a reference current $I_{ref}$ and outputs an output current $I_{out}$ using the reference current $I_{ref}$. Accordingly, when such current drivers 11 are arranged in series, each of the current drivers receives an output current $I_{out}$ from the current driver at the previous stage as a reference current $I_{ref}$, so that a large-scale current driving apparatus is configured.

EMBODIMENT 12

<Influence of Resistance Variation>

When the resistance value of a current-voltage conversion resistance 1101R and the resistance value of a current-voltage conversion resistance 1101L differ from each other, a reference voltage $V_{ref}$ and a comparative voltage $V_{rb}$ always differ from each other. For example, when the comparative voltage $V_{rb}$ is higher than the reference voltage $V_{ref}$, the voltage value of a bias voltage $V_{bias}$ generated by a differential amplifier 103 is larger than that the bias voltage $V_{bias}$ should originally have. Accordingly, an output current $I_{out}$ of a current driver is always larger than the reference current. $I_{ref}$. If errors in output currents $I_{out}$ are inclined toward one direction because of characteristic variation of transistors in this way, light-emission luminance of a display panel changes markedly in driving the display panel using a plurality of current drivers.

<Overall Configuration>

Figure 12:
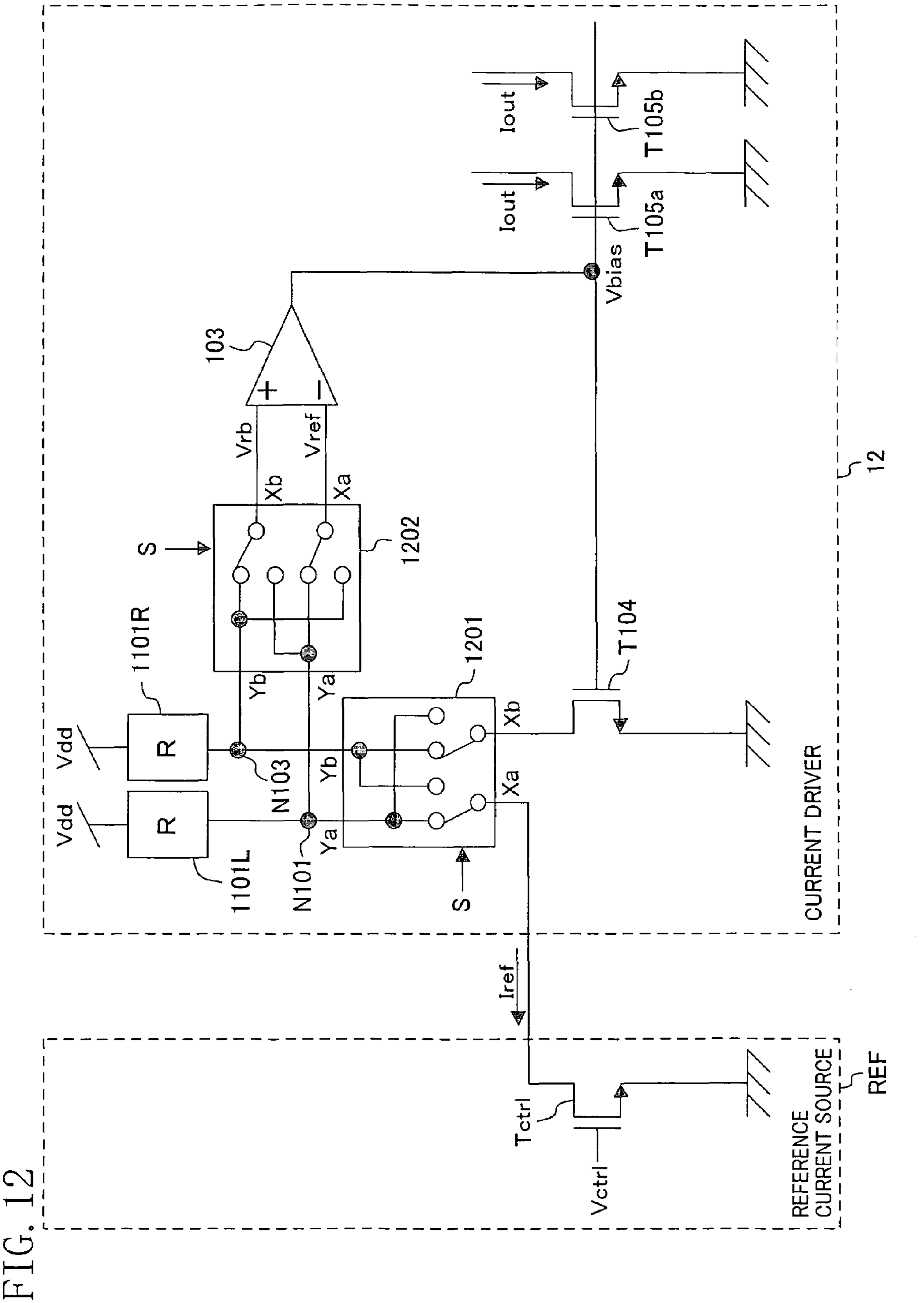
FIG. 12 is a view illustrating an overall configuration of a current driver according to a twelfth embodiment of the present invention.

FIG. 12 illustrates an overall configuration of a current driver 12 according to a twelfth embodiment of the present invention. The current driver 12 includes: a transistor switching section 1201; and a differential amplifier switching section 1202, in addition to the components of the current driver 11 illustrated in FIG. 11. In the transistor switching section 1201, an input/output terminal Xa is connected to a reference current source REF, an input/output terminal Xb is connected to the drain of a bias voltage generating transistor T104, an input/output terminal Ya is connected to a node N101, and an input/output terminal Yb is connected to a node N103. In the differential amplifier switching section 1202, an input/output terminal Xa is connected to the inverting input terminal of a differential amplifier 103, an input/output terminal Xb is connected to an non-inverting input terminal of the differential amplifier 103, an input/output terminal Ya is connected to the node N101, and an input/output terminal Yb is connected to the node N103. In each of the transistor switching section 1201 and the differential amplifier switching section 1202, one of the input/output terminals Xa and Xb is connected to the input/output terminal Ya and the other is connected to the input/output terminal Yb, in accordance with an externally-input control signal S. That is, in the current driver 12, the locations of a current-voltage conversion resistance 1101R and a current-voltage conversion resistance 1101L are replaced with each other regularly.

<Internal Configurations of Switching Sections 1201 and 1202>

Figure 13:
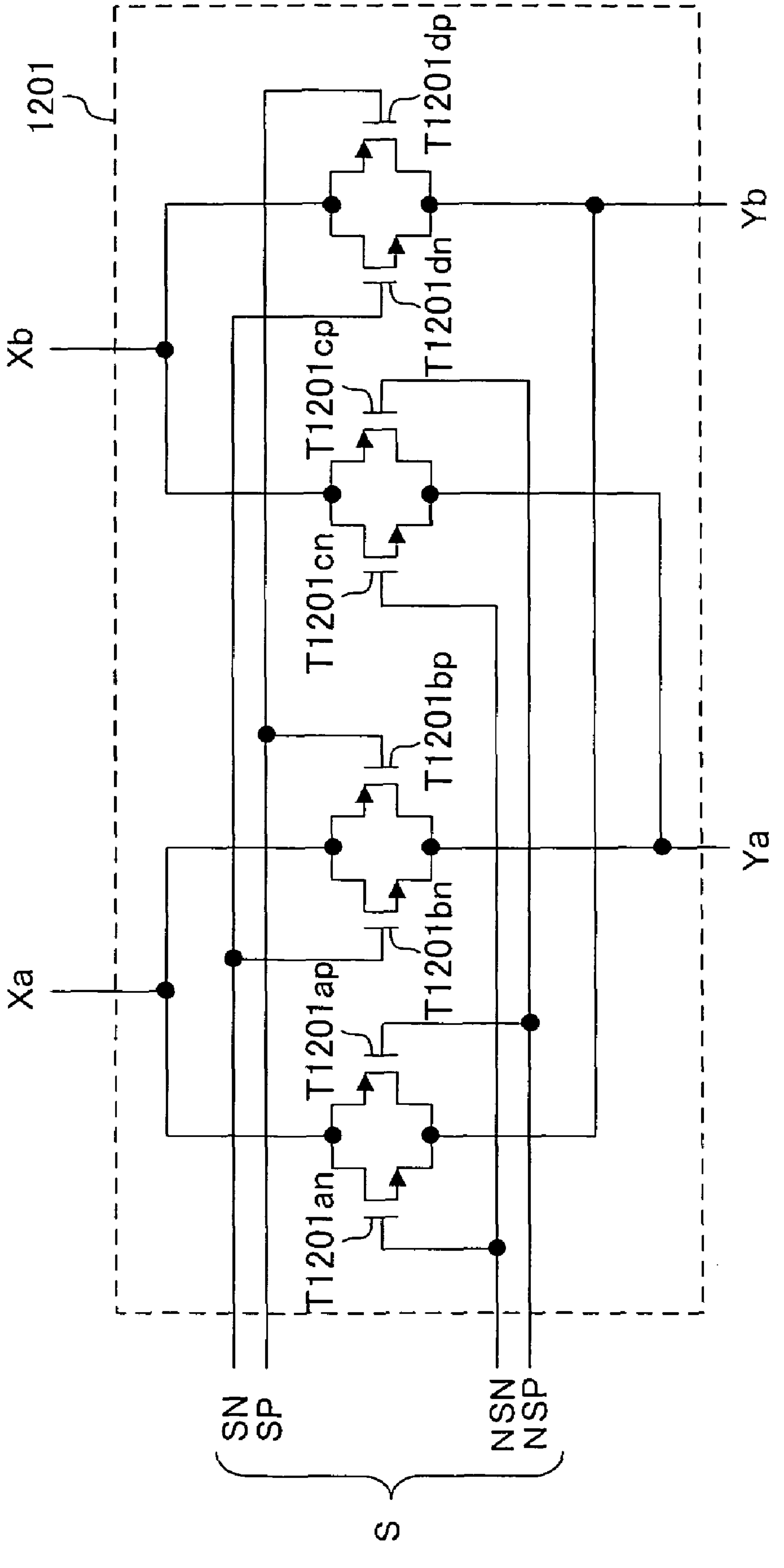
FIG. 13 is a view illustrating an internal configuration of a transistor switching section illustrated in FIG. 12.

Now, the internal configurations of the transistor switching section 1201 and the differential amplifier switching section 1202 illustrated in FIG. 12 will be described. The transistor switching section 1201 and the differential amplifier switching section 1202 have the same configuration, and thus the internal configuration of the transistor switching section 1201 is illustrated in FIG. 13 as a representative.

The transistor switching section 1201 includes switching transistors T1201*an*, T1201*ap*, T1201*bn*, T1201*bp*, T1201*cn*, T1201*cp*, T1201*dn* and T1201*dp*. The control signal S includes control signals SN, SP, NSN and NSP.

The switching transistors T1201*an* and T1201*ap* are provided in parallel between the input/output terminal Xa and the input/output terminal Yb. The control signal NSN is input to the gate of the switching transistor T1201*an* and the control signal NSP is input to the gate of the switching transistor T1201*ap*.

The switching transistors T1201*bn* and T1201*bp* are provided in parallel between the input/output terminal Xa and the input/output terminal Ya. The control signal SN is input to the gate of the switching transistor T1201*bn* and the control signal SP is input to the gate of the switching transistor T1201*bp*.

The switching transistors T1201*cn* and T1201*cp* are provided in parallel between the input/output terminal Xb and the input/output terminal Ya. The control signal NSN is input to the gate of the switching transistor T1201*cn* and the control signal NSP is input to the gate of the switching transistor T1201*cp*.

The switching transistors T1201*dn* and T1201*dp* are provided in parallel between the input/output terminal Xb and the input/output terminal Yb. The control signal SN is input to the gate of the switching transistor T1201*dn* and the control signal SP is input to the gate of the switching transistor T1201*dp*.

<Operation>

Figure 14:
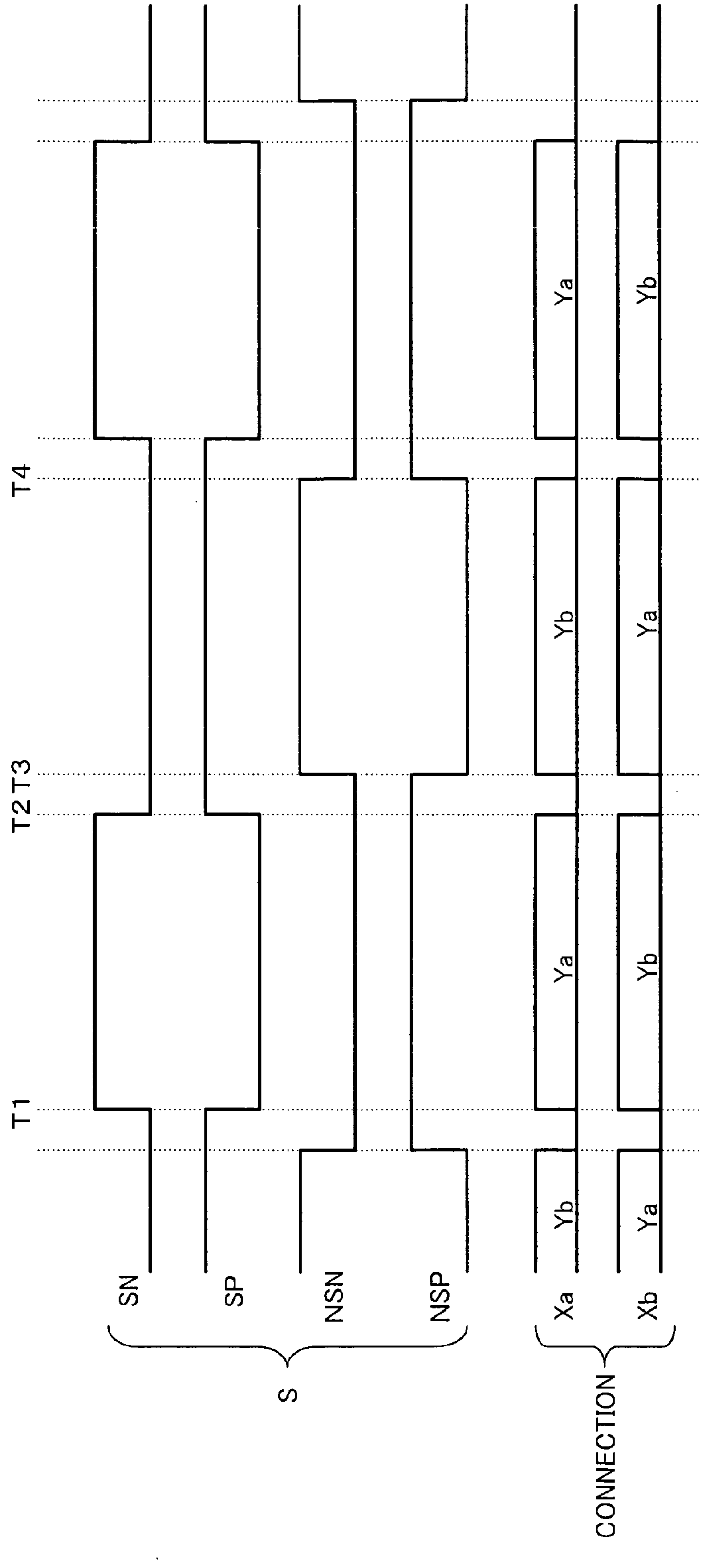
FIG. 14 is a timing chart showing operation of the transistor switching section illustrated in FIG. 13.

Now, operation of the transistor switching section 1201 illustrated in FIGS. 12 and 13 will be described with reference to FIG. 14.

At time T1, the control signal SN rises to the H level and the control signal SP falls to the L level. This activates the switching transistors T1201*bn*, T1201*bp*, T1201*dn* and T1201*dp*. Since the control signal NSN is at the L level and the control signal NSP is at the H level, the switching transistors T1201*an*, T1201*ap*, T1201*cn* and T1201*cp* are inactivated. Accordingly, the input/output terminal Xa is connected to the input/output terminal Ya, and the input/output terminal Xb is connected to the input/output terminal Yb. In this manner, the node N101 is connected to the reference current source REF and the inverting input terminal of the differential amplifier 103, and the node N103 is connected to the drain of a bias voltage generating transistor T104 and the non-inverting input terminal of the differential amplifier 103 (see FIG. 12), so that a reference voltage $V_{ref}$ is generated by a current-voltage conversion resistance 1101L and a comparative voltage $V_{rb}$ is generated by a current-voltage conversion resistance 1101R.

At time T2, the control signal SN falls to the L level and the control signal SP rises to the H level. This inactivates the switching transistors T1201*bn*, T1201*bp*, T1201*dn* and T1201*dp*. Accordingly, the input/output terminals Xa and Xb are not connected to any of the input/output terminals Ya and Yb.

At time T3, the control signal NSN rises to the H level and the control signal NSP falls to the L level. This activates the switching transistors T1201*an*, T1201*ap*, T1201*cn* and T1201*cp*. Accordingly, the input/output terminal Xa is connected to the input/output terminal Yb and the input/output terminal Xb is connected to the input/output terminal Ya. In this manner, the node N103 is connected to the reference current source REF and the inverting input terminal of the differential amplifier 103, and the node N101 is connected to the drain of the bias voltage generating transistor T104 and the non-inverting input terminal of the differential amplifier 103 (see FIG. 12), so that a reference voltage $V_{ref}$ is generated by the current-voltage conversion resistance 1101R and a comparative voltage $V_{rb}$ is generated by the current-voltage conversion resistance 1101L.

At time T4, the control signal NSN falls to the L level and the control signal NSP rises to the H level. This inactivates the switching transistors T1201*an*, T1201*ap*, T1201*cn* and T1201*cp*. Accordingly, the input/output terminals Xa and Xb are not connected to any of the input/output terminals Ya and Yb.

<Timing of Switching>

The signal levels of the control signal S (the control signals SN, SP, NSN and NSP) may be switched at arbitrary timings but are preferably switched regularly. For example, if the signal levels of the control signals SN, SP, NSN and NSP are switched at every one frame, the timing of change of the current value of an output current $I_{out}$ coincides with the timing of switching of an image displayed on a display panel, so that the change of brightness on the display panel becomes less conspicuous.

The switching of the signal levels of the control signals SN, SP, NSN and NSP may be performed in a vertical blanking period.

<Effects>

As described above, the locations of the current-voltage conversion resistances 1101R and 1101L are replaced with each other according to the control signals SN, SP, NSN and NSP, so that errors caused by the characteristic difference between the current-voltage conversion resistances 1101R and 1101L are averaged. In this manner, errors in output currents $I_{out}$ from the current driver 12 to display element circuits are not inclined toward one direction, so that variation in light-emission luminance of a display panel is reduced.

The signal levels of the control signals R and NR are switched so as to provide a period in which all the switching transistors are inactivated, so that stable switching operation is performed without occurrence of short circuits between the reference current source REF and the node N103 and between the reference current source REF and the bias voltage generating transistor T104.

In the display panel, the area for which the current value of an output current $I_{out}$ is switched is preferably small. For example, the current value of an output current $I_{out}$ is preferably switched for every one line. Then, the variation in light-emission luminance change on the display panel is further suppressed.

EMBODIMENT 13

<Overall Configuration>

Figure 15:
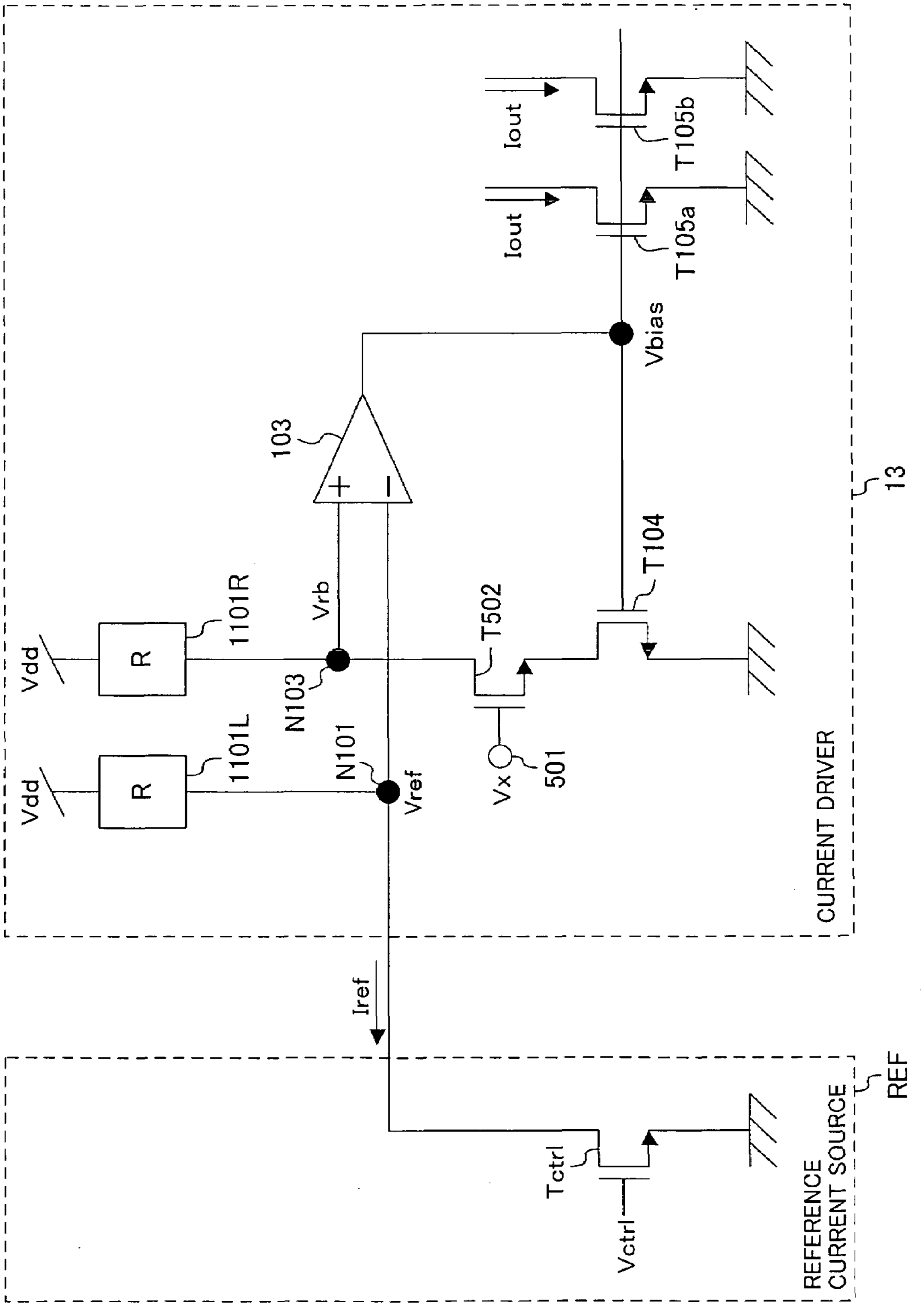
FIG. 15 is a view illustrating an overall configuration of a current driver according to a thirteenth embodiment of the present invention.

FIG. 15 illustrates an overall configuration of a current driver 13 according to a thirteenth embodiment of the present invention. The current driver 13 includes the clamping voltage supplying terminal 501 and the voltage clamping transistor T502 illustrated in FIG. 5, in addition to the components of the current driver 11 illustrated in FIG. 11. The other part of the configuration is the same as that illustrated in FIG. 11. The voltage clamping transistor T502 is provided between a node N103 and a bias voltage generating transistor T104 and receives, at its gate, a clamping voltage $V_x$ from the clamping voltage supplying terminal 501.

<Operation>

Operation of the voltage clamping transistor T502 illustrated in FIG. 15 is the same as that of the fifth embodiment (FIG. 5).

<Effects>

As described above, the drain voltage of the bias voltage generating transistor T104 is made equal to the drain voltages of driving transistors T105*a* and T105*b*, so that errors due to drain voltage dependence in the driving transistors T105*a* and T105*b* are reduced.

EMBODIMENT 14

<Overall Configuration>

Figure 16:
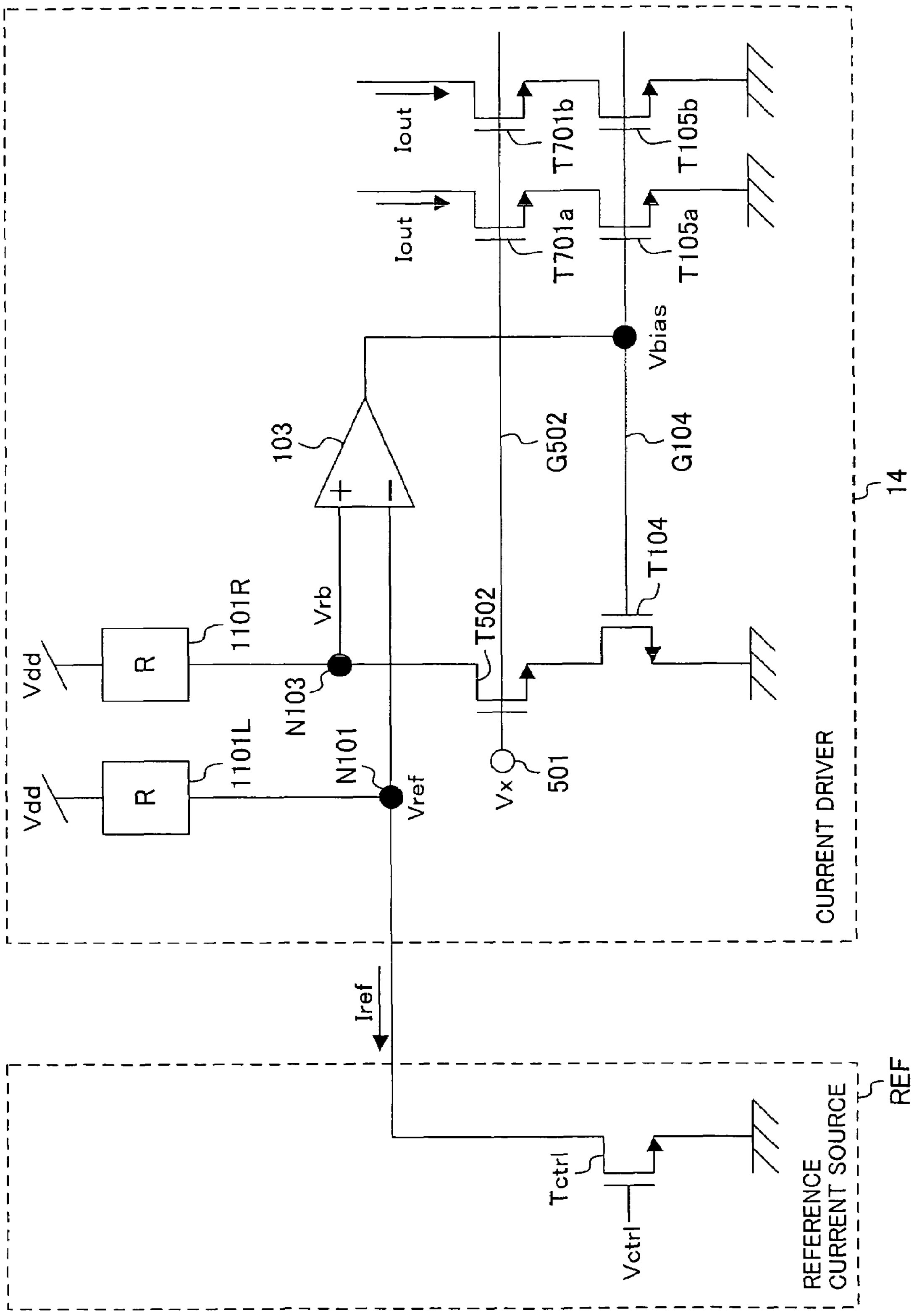
FIG. 16 is a view illustrating an overall configuration of a current driver according to a fourteenth embodiment of the present invention.

FIG. 16 illustrates an overall configuration of a current driver 14 according to a fourteenth embodiment of the present invention. The current driver 14 includes the output voltage clamping transistors T701*a* and T701*b* illustrated in FIG. 7, in addition to the components of the current driver 13 illustrated in FIG. 15. The other part of the configuration is the same as that illustrated in FIG. 15.

<Adjustment of Drain Voltage>

Operation of a voltage clamping transistor T502 and output voltage clamping transistors T701*a* and T701*b* illustrated in FIG. 16 is the same as that of the seventh embodiment (FIG. 7).

<Effects>

As described above, the drain voltage of a bias voltage generating transistor T104 is made substantially equal to the drain voltages of driving transistors T105*a* and T105*b*, so that errors due to drain voltage dependence in the driving transistors T105*a* and T105*b* are reduced.

EMBODIMENT 15

<Overall Configuration>

Figure 17:
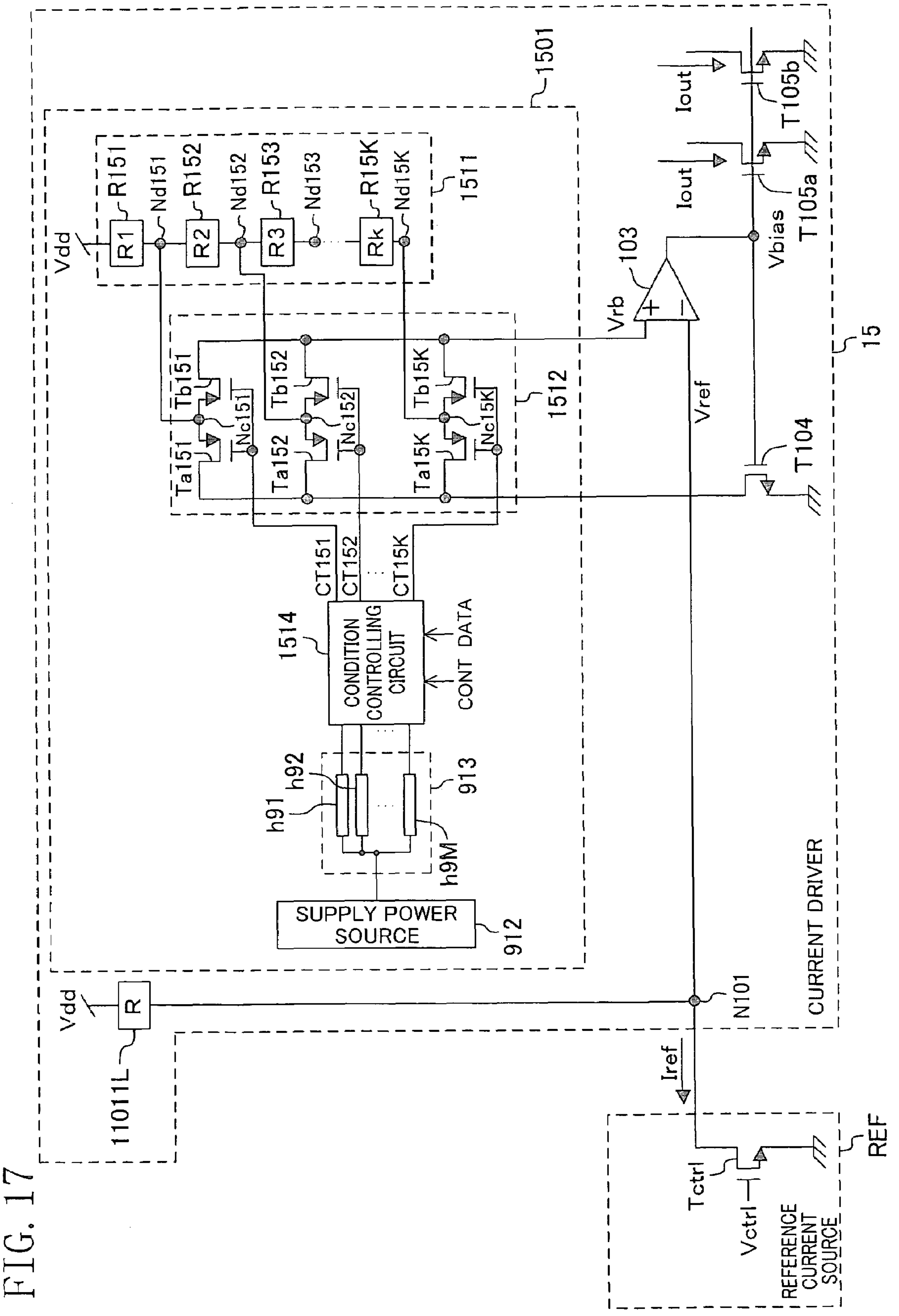
FIG. 17 is a view illustrating an overall configuration of a current driver according to a fifteenth embodiment of the present invention.

FIG. 17 illustrates an overall configuration of a current driver 15 according to a fifteenth embodiment of the present invention. The current driver 15 includes a bias voltage adjusting section 1501, instead of the current-voltage conversion resistance 1101R illustrated in FIG. 11. The other part of the configuration is the same as that illustrated in FIG. 11. The bias voltage adjusting section 1501 generates a comparative voltage $V_{rb}$ having a voltage value according to the resistance value of the bias voltage adjusting section 1501 and the current value of a drain current $I_d$ flowing in a bias voltage generating transistor T104. The resistance value of the bias voltage adjusting section 1501 may be set at an arbitrary value.

<Internal Configuration of Bias Voltage Adjusting Section 1501>

The bias voltage adjusting section 1501 illustrated in FIG. 17 includes: a current-voltage converting unit 1511; a resistance adjusting unit 1512; a supply power source 912; a condition storing unit 913; and a condition controlling circuit 1514.

The current-voltage converting unit 1511 includes K current-voltage conversion resistances R151 through R15K. The current-voltage conversion resistances R151 through R15K are provided in series between an internal power supply node Vdd and a node Nd15K. Each of the current-voltage conversion resistances R151 through R15K is provided between associated two of nodes Nd151 through Nd15K.

The resistance adjusting unit 1512 includes: K selecting transistors Ta151 through Ta15K; and K selecting transistors Tb151 through Tb15K. The selecting transistors Ta151 through Ta15K are associated with the selecting transistors Tb151 through Tb15K in a one-to-one relationship. The selecting transistors. Ta151 through Ta15K and Tb151 through Tb15K are provided between the non-inverting input terminal of a differential amplifier 103 and the bias voltage generating transistor T104. The selecting transistors Ta151 through Ta15K are provided between the bias voltage generating transistor T104 and respective nodes Nc151 through Nc15K and receive, at their gates, control signals CT151 through CT15K from the condition controlling circuit 1514. The selecting transistors Tb151 through Tb15K are provided between the respective nodes Nc151 through Nc15K and the non-inverting input terminal of the differential amplifier 103 and receive, at their gates, the control signals CT151 through CT15K from the condition controlling circuit 1514. The nodes Nc151 through Nc15K are connected to the respective nodes Nd151 through Nd15K.

When the control signals CT151 through CT15K are at the L level, these signals are voltages for activating the selecting transistors Ta151 through Ta15K and Tb151 through Tb15K (pMOS transistors) whereas when the control signals CT151 through CT15K are at the H level, these signals are voltages for inactivating the selecting transistors Ta151 through Ta15K and Tb151 through Tb15K.

The resistance value of the bias voltage adjusting section 1501 may be set at an arbitrary value by arbitrarily connecting the current-voltage conversion resistances R151 through R15K to the drain of the bias voltage generating transistor T104 and to the non-inverting input terminal of the differential amplifier 103 using the selecting transistors Ta151 through Ta15K and Tb151 through Tb15K.

The supply power source 912 is the same as that illustrated in FIG. 9.

The condition storing unit 913 is the same as that illustrated in FIG. 9. In this embodiment, it is assumed that the condition storing unit 913 stores binary data representing a node to be selected from the nodes Nd151 through Nd15K. For example, when a fuse h91 is blown and the other fuses h92 through h9M are not blown, the condition storing unit 913 stores data showing that the node to be selected is the "node Nd151". On the other hand, when the fuses h91 and h92 are blown and the other fuses h93 through h9M are not blown, the condition storing unit 913 stores data showing that the node to be selected is the "node Nd153".

As the condition controlling circuit 914, the condition controlling circuit 1514 enters a condition fixing mode or an emulating mode, according to a control signal CONT input from outside the circuit.

In the condition fixing mode, as the condition controlling circuit 914, the condition controlling circuit 1514 decodes binary data stored in the condition storing unit 913, thereby outputting control signals CT151 through CT15K. For example, when the fuse h91 is blown in the condition storing unit 913, the condition controlling circuit 1514 sets the control signal CT151 at the L level and the other control signals CT152 through CT15K at the H level.

In the emulating mode, as the condition controlling circuit 914, the condition controlling circuit 1514 emulates the states (i.e., blown or not blown) of the fuses h91 through h9M in the condition storing unit 913 according to a data signal DATA input from outside the circuit, thereby outputting control signals CT92 through CT9K. For example, when a data signal DATA for emulating a state in which the fuse h91 is blown is input to the condition controlling circuit 1514, the condition controlling circuit 1514 sets the control signal CT151 at the L level and the other control signals CT152 through CT15K at the H level. On the other hand, when a data signal DATA for emulating a state in which the fuses h91 and h92 are blown is input to the condition controlling circuit 1514, the condition controlling circuit 1514 sets the control signal CT153 at the L level and the other control signals CT151, CT152 and CT154 through CT15K at the H level.

<Operation>

Now, operation of the bias voltage adjusting section 1501 illustrated in FIG. 17 will be described.

[Condition Fixing Mode]

The condition controlling circuit 1514 enters a condition fixing mode when receiving a control signal CONT requiring switching to the condition fixing mode. Then, the condition controlling circuit 1514 connects one terminal of each of the fuses h91 through h9M included in the condition storing unit 913 to the condition controlling circuit 1514 itself, and reads binary data represented by the states (i.e., blown or not blown) of the fuses. Thereafter, the condition controlling circuit 1514 decodes the binary data that has been read out and outputs control signals CT151 through CT15K to the gates of the selecting transistors Ta151 through Ta15K and Tb151 through Tb15K.

In this case, when the fuse h91 is blown, the condition controlling circuit 1514 sets the control signal CT151 at the L level (active) and the control signals CT152 through CT15K at the H level (inactive). Accordingly, the selecting transistors Ta151 and Tb151 are activated so that one of the terminals of the current-voltage conversion resistance R151 is connected to the non-inverting input terminal of the differential amplifier 103 and the drain of the bias voltage generating transistor T104. Accordingly, a comparative voltage $V_{rb}$ according to the resistance value of the current-voltage conversion resistance R151 is generated at the drain of the bias voltage generating transistor T104.

In this manner, the output states of the control signals CT151 through CT15K stored in the condition storing unit 913 are reproduced. In addition, these output states are maintained.

[Emulating Mode]

On the other hand, the condition controlling circuit 1514 enters an emulating mode when receiving a control signal CONT requiring switching to the emulating mode. Then, the condition controlling circuit 1514 outputs control signals CT151 through CT15K according to a data signal DATA.

In this case, when a data signal DATA for emulating a state in which the fuse h92 is blown is input to the condition controlling circuit 1514, the condition controlling circuit 1514 sets the control signal CT152 at the L level (active) and the control signals CT151 and CT153 through CT15K at the H level (inactive). Accordingly, the selecting transistors Ta152 and Tb152 are activated, so that one of the terminals of the current-voltage conversion resistance R152 is connected to the non-inverting input terminal of the differential amplifier 103 and the drain of the bias voltage generating transistor T104. Accordingly, a comparative voltage $V_{rb}$ according to the resistance values of the current-voltage conversion resistances R151 and R152 is generated at the drain of the bias voltage generating transistor T104.

In this manner, the voltage value of a drain voltage generated at the bias voltage generating transistor T104 is adjusted.

<Effects>

As described above, the performance of the current-voltage converting unit 1511 is adjusted by the condition controlling circuit 1514, so that the current driver is allowed to operate under conditions (optimum conditions) in which the states of output currents $I_{out}$ from the driving transistors T105*a* and T105*b* are optimized.

In addition, if the output states of the control signals CT151 through CT15K are stored by blowing the fuses h91 through h9M included in the condition storing unit 913 based on the emulation result, the conditions when output currents $I_{out}$ are in optimum states are maintained.

EMBODIMENT 16

Prior to description of a current driver according to this embodiment, internal configurations of differential amplifiers illustrated in FIGS. 1 through 12 and 15 through 17 will be described. The differential amplifiers illustrated in FIGS. 1 through 12 and 15 through 17 have the same internal configuration, and thus the internal configuration of the differential amplifier 103 illustrated in FIG. 1 will be described as a representative.

<Internal Configuration of Differential Amplifier 103>

Figure 18:
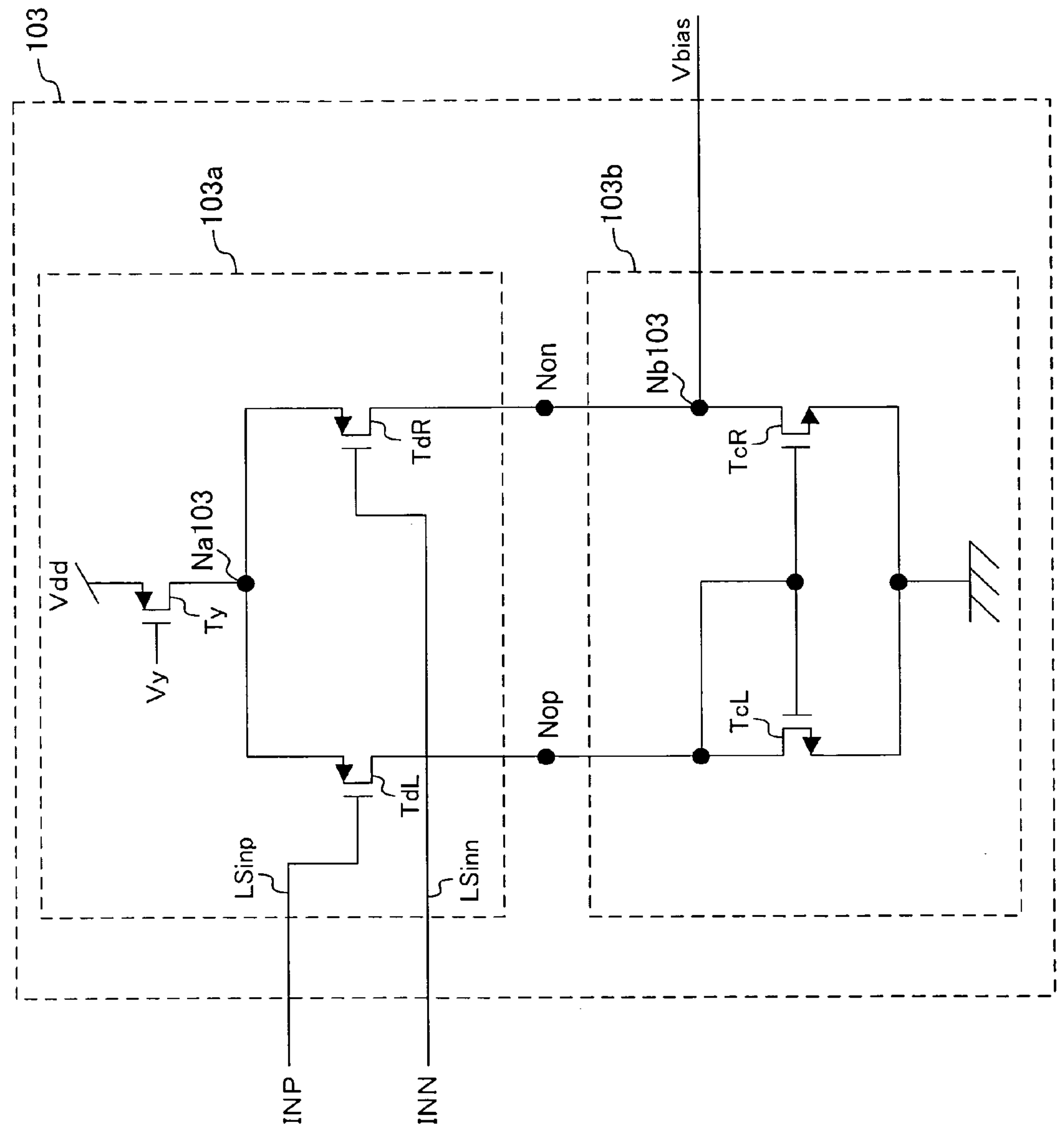
FIG. 18 is a view illustrating an internal configuration of a differential amplifier illustrated in FIG. 1.

FIG. 18 illustrates an internal configuration of the differential amplifier 103 illustrated in FIG. 1. The differential amplifier 103 includes: a differential amplifier unit 103*a* and a current mirror unit 103*b*.

[Differential Amplifier Unit]

The differential amplifier unit 103*a* includes: a current adjusting transistor Ty; signal lines LSinp and LSinn; and differential amplifier transistors TdL and TdR. The current adjusting transistor Ty is provided between an internal power supply node Vdd and a node Na103 and receives an adjusting voltage $V_y$ at its gate. A signal (e.g., a reference voltage $V_c$, a gate voltage $V_{id}$ and a reference voltage $V_{ref}$) input to the inverting input terminal is input to the signal line LSinn. A signal (e.g., a drain voltage $V_{rb}$ and a comparative voltage $V_{rb}$) input to the non-inverting input terminal is input to the signal line LSinp. The differential amplifier transistor TdL is provided between the node Na103 and a node Nop and has its gate connected to the signal line LSinp.

Accordingly, a current according to a signal input to the gate of the differential amplifier transistor TdL through the signal line LSinp flows in the node Nop. The differential amplifier transistor TdR is provided between the node Na103 and a node Non and has its gate connected to the signal line LSinn. Accordingly, a current according to a signal input to the gate of the differential amplifier transistor TdR through the signal line LSinn flows in the node Non.

[Current Mirror Unit]

The current mirror unit 103*b* includes current mirror transistors TcL and TcR. The current mirror transistor TcL is provided between the node Nop and the ground node. The current mirror transistor TcR is provided between the node Non and the ground node. The gate of the current mirror transistor TcL is connected to the drain of the current mirror transistor TcL and the gate of the current mirror transistor TcR. A voltage according to the ratio between the resistance value of the differential amplifier transistor TdR and the resistance value of the current mirror transistor TcR is generated at a node Nb103 located between the node Non and the current mirror transistor TcR. The voltage generated at the node Nb103 is output as a bias voltage $V_{bias}$.

<Offset of Differential Amplifier 103>

In the current driver 11 illustrated in FIG. 11, if the differential amplifier transistors TdR and TdL in the differential amplifier 103 illustrated in FIG. 18 have characteristic difference, the bias voltage $V_{bias}$ increases/decreases to the degree of this characteristic difference. For example, if the differential amplifier transistor TdR has a current driving ability higher than that of the differential amplifier transistor TdL, the voltage value of the bias voltage $V_{bias}$ is larger than that the bias voltage $V_{bias}$ should originally have. In this case, output currents $I_{out}$ of the current driver are always larger than a reference current $I_{ref}$. If errors in current values of output currents $I_{out}$ are inclined toward one direction in this way, light-emission luminance of a display panel changes markedly in driving the display panel using a plurality of current drivers.

<Configuration of this Embodiment>

An overall configuration of a current driver according to a sixteenth embodiment of the present invention is the same as that illustrated in FIG. 11, except for the internal configuration of the differential amplifier 103. The differential amplifier used in this embodiment includes a differential amplifier unit 1603*a* illustrated in FIG. 19, instead of the differential amplifier unit 103*a* illustrated in FIG. 18. The other part of the configuration is the same as that illustrated in FIG. 18. The differential amplifier unit 1603*a* illustrated in FIG. 19 includes switching transistors TLr1, TLnr1, TRr1, TRnr1, TLr2, TLnr2, TRr2 and TRnr2, in addition to the components of the differential amplifier unit 103*a* illustrated in FIG. 18.

The switching transistors TLr1 and TLnr1 are provided in series between a signal line LSinp and a signal line LSinn. The switching transistor TLr1 is provided between the signal line LSinp and a node NIL and receives a control signal R at its gate. The switching transistor TLnr1 is provided between the node NIL and the signal line LSinn and receives a control signal NR at its gate. The node NIL is connected to the gate of a differential amplifier transistor TdL. The switching transistors TRnr1 and TRr1 are provided in series between the signal line LSinp and the signal line LSinn. The switching transistor TRnr1 is provided between the signal line LSinp and a node N1R and receives a control signal NR at its gate. The switching transistor TRr1 is provided between the node N1R and the signal line LSinn and receives a control signal R at its gate. The node N1R is connected to the gate of a differential amplifier transistor TdR.

The switching transistor TLr2 is provided between the differential amplifier transistor TdL and a node Nop and receives a control signal R at its gate. The switching transistor TLnr2 is provided between the differential amplifier transistor TdL and a node Non and receives a control signal NR at its gate. The switching transistor TRnr2 is provided between the differential amplifier transistor TdR and the node Nop and receives a control signal NR at its gate. The switching transistor TRr2 is provided between the differential amplifier transistor TdR and the node Non and receives a control signal R at its gate.

When the control signals R and NR are at the L level, these signals are voltages for activating the switching transistors TLr1, TLnr1, TRr1, TRnr1, TLr2, TLnr2, TRr2 and TRnr2 (pMOS transistors) whereas when the control signals R and NR are at the H level, these signals are voltages for inactivating the switching transistors TLr1, TLnr1, TRr1, TRnr1, TLr2, TLnr2, TRr2 and TRnr2. For example, when the control signals R and NR are at the L level, these signals are voltages lower than a voltage ($V_{ddmax}-V_{tp}$) obtained by subtracting the threshold voltage $V_{tp}$ of the pMOS transistors from the maximum voltage $V_{ddmax}$ in an internal power supply. When the control signals R and NR are at the H level, these signals are voltages equal to the maximum voltage $V_{ddmax}$ in the internal power supply.

<Operation>

Now, operation of the differential amplifier unit 1603*a* illustrated in FIG. 19 will be described.

[Connection 1]

First, the control signal NR is set at the H level (inactive) and the control signal R is set at the L level (active). In this case, the switching transistors TLr1 and TRr1 are activated, so that the gate of the differential amplifier transistor TdL and the signal line LSinp are connected to each other and the gate of the differential amplifier transistor TdR and the signal line LSinn are connected to each other. Accordingly, a current according to a signal input to the non-inverting input terminal is generated in the differential amplifier transistor TdL and a current according to a signal input to the inverting input terminal is generated in the differential amplifier transistor TdR.

On the other hand, the switching transistors TLr2 and TRr2 are activated, so that the drain of the differential amplifier transistor TdL and the node Nop are connected to each other and the drain of the differential amplifier transistor TdR and the node Non are connected to each other. Accordingly, the current generated in the differential amplifier transistor TdL flows in the node Nop and the current generated in the differential amplifier transistor TdR flows in the node Non.

In this manner, a current according to a signal input to the non-inverting input terminal flows in the node Nop and a current according to a signal input to the inverting input terminal flows in the node Non.

[Connection 2]

On the other hand, the control signal NR is set at the L level (active) and the control signal R is set at the H level (inactive). In this case, the switching transistors TLnr1 and TRnr1 are activated, so that the gate of the differential amplifier transistor TdL and the signal line LSinn are connected to each other and the gate of the differential amplifier transistor TdR and the signal line LSinp are connected to each other. Accordingly, a current according to a signal input to the inverting input terminal is generated in the differential amplifier transistor TdL and a current according to a signal input to the non-inverting input terminal is generated in the differential amplifier transistor TdR.

On the other hand, the switching transistors TLnr2 and TRnr2 are activated, so that the drain of the differential amplifier transistor TdL and the node Non are connected to each other and the drain of the differential amplifier transistor TdR and the node Nop are connected to each other. Accordingly, the current generated in the differential amplifier transistor TdL flows in the node Non and the current generated in the differential amplifier transistor TdR flows in the node Nop.

In this manner, a current according to a signal input to the non-inverting input terminal flows in the node Nop and a current according to a signal input to the inverting input terminal flows in the node Non.

<Timing of Switching>

The signal levels of the control signals R and NR are switched at arbitrary timings but are preferably switched at regularly. For example, if the signal levels of the control signals R and NR are switched at every one frame, the timing of change of the current value of an output current $I_{out}$ coincides with the timing of switching of an image displayed on a display panel, so that a brightness change on the display panel becomes less conspicuous.

The switching of signal levels of the control signals R and NR may be performed in a vertical blanking period.

<Effects>

As described above, the locations of the differential amplifier transistors TdR and TdL are replaced with each other according to the control signals R and NR, so that errors due to the characteristic difference between the differential amplifier transistors TdR and TdL are averaged. In this manner, errors in output currents $I_{out}$ output from the current driver to display element circuits are not inclined toward one direction, so that variation in light-emission luminance of the display panel is reduced.

In FIG. 18, for example, p-transistors are used as the differential amplifier transistors TdR and TdL and n-transistors are used as current mirror transistors TcL and TcR. Alternatively, n-transistors may be used as the differential amplifier transistors TdR and TdL and p-transistors may be used as current mirror transistors TcL and TcR. In such a case, it is sufficient to change the control signals and lines, for example, appropriately.

A configuration in which an output section for stabilizing the voltage value of the bias voltage $V_{bias}$ may be employed.

EMBODIMENT 17

<Offset of Differential Amplifier 103>

In the differential amplifier illustrated in FIG. 18, if the current mirror transistors TcR and TcL have characteristic difference, the bias voltage $V_{bias}$ increases/decreases to the degree of this characteristic difference in the configuration illustrated in FIG. 11. For example, if the current mirror transistor TcL has a current driving ability higher than that of the current mirror transistor TcR, the voltage value of the bias voltage $V_{bias}$ is larger than that the bias voltage $V_{bias}$ should originally have. In this case, output currents $I_{out}$ of the current driver are always larger than the reference current $I_{ref}$. If errors in output currents $I_{out}$ are inclined toward one direction because of the characteristic difference between transistors in this way, light-emission luminance of a display panel changes markedly in driving the display panel using a plurality of current drivers.

<Overall Configuration>

An overall configuration of a current driver according to a seventeenth embodiment of the present invention is the same as that illustrated in FIG. 11, except for the internal configuration of the differential amplifier 103. The differential amplifier for use in this embodiment includes a current mirror unit 1703*b* illustrated in FIG. 20, instead of the current mirror unit 103*b* illustrated in FIG. 18. The other part of the configuration is the same as that illustrated in FIG. 18. The current mirror unit 1703*b* illustrated in FIG. 20 includes switching transistors TLr3, TLnr3, TRr3, TRnr3, TLr4, TLnr4, TRr4 and TRnr4, in addition to the components of the current mirror unit 103*b* illustrated in FIG. 18.

The switching transistor TLnr3 is provided between a node Nop and a node N3L and receives a control signal NR at its gate. The switching transistor TLr3 is provided between a node Non and the node N3L and receives a control signal R at its gate. The switching transistor TRr3 is provided between the node Nop and a node N3R and receives a control signal R at its gate. The switching transistor TRnr3 is provided between the node Non and the node N3R and receives a control signal NR at its gate.

Nodes N4L1 and N4L2 and a current mirror transistor TcL are provided in series between the node N3L and a ground node. The node N4L1 is provided between the node N3L and the node N4L2. The node N4L2 is provided between the node N4L1 and the current mirror transistor TcL. The current mirror transistor TcL is provided between the node N4L2 and the ground node and has its gate connected to a node N4*c*.

Nodes N4R1 and N4R2 and a current mirror transistor TcR are provided in series between the node N3R and the ground node. The node N4R1 is provided between the node N3R and the node N4R2. The node N4R2 is provided between the node N4R1 and the current mirror transistor TcR. The current mirror transistor TcR is provided between the node N4R2 and the ground node and has its gate connected to the node N4*c*.

The switching transistors TLr4 and TRnr4 are provided in series between the node N4L1 and the node N4R1. The switching transistor TLr4 is provided between the node N4L1 and a node N4*a* and receives a control signal R at its gate. The switching transistor TRnr4 is provided between the node N4*a* and the node N4R1 and receives a control signal NR at its gate.

The switching transistors TLnr4 and TRr4 are connected in series between the node N4L2 and the node N4R2. The switching transistor TLnr4 is provided between the node N4L2 and a node N4*b* and receives a control signal NR at its gate. The switching transistor TRr4 is provided between the node N4*b* and the node N4R2 and receives a control signal R at its gate. The node N4*b* is connected to the node N4*c*.

When the control signals R and NR are at the L level, these signals are voltages for inactivating the switching transistors TLr3, TLnr3, TRr3, TRnr3, TLr4, TLnr4, TRr4 and TRnr4 (nMOS transistors) whereas when the control signals R and NR are at the H level, these signals are voltages for activating the switching transistors TLr3, TLnr3, TRr3, TRnr3, TLr4, TLnr4, TRr4 and TRnr4. For example, when the control signals R and NR are at the L level, these signals are voltages equal to the minimum voltage $V_{ddmin}$ in an internal power supply. When the control signals R and NR are at the H level, these signals are voltages ($\geqq V_{ddmin}+V_{tn}\times2$) equal to or higher than the voltage obtained by adding the voltage twice as high as the threshold voltage $V_{tn}$ necessary for activating the switching transistors to the minimum voltage $V_{ddmin}$ in the internal power supply.

Alternatively, pMOS transistors may be used as the switching transistors TLr3, TLnr3, TRr3 and TRnr3. In this case, the activating polarity of an applied voltage as a control signal is inverted (i.e., active at the L level and inactive at the H level), the control signal R is supplied to the switching transistors TLr3 and TRnr3 and the control signal NR is supplied to the switching transistors TLnr3 and TRr3. When an applied voltage as a control signal is at the L level, this voltage is equal to the minimum voltage $V_{ddmin}$ in the internal power supply and is equal to the maximum voltage $V_{ddmax}$, when the voltage is at the H level.

<Operation>

Figure 20:
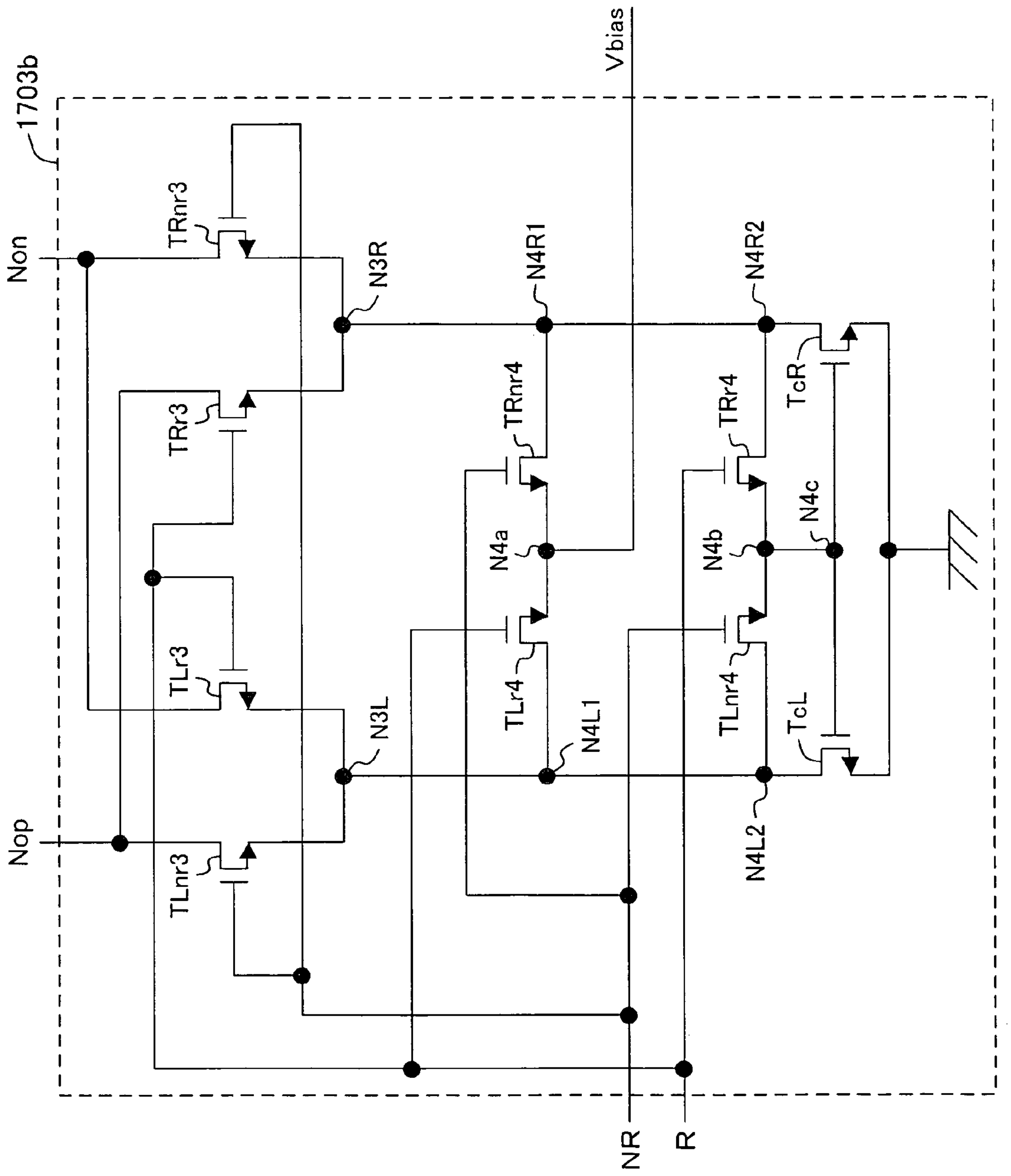
FIG. 20 is a view illustrating an internal configuration of a current mirror section included in a differential amplifier according to a seventeenth embodiment of the present invention.

Now, operation of the current mirror unit 1703*b* illustrated in FIG. 20 will be described.

[Connection 1]

First, the control signal NR is set at the H level (active) and the control signal R is set at the L level (inactive). In this case, the switching transistors TLnr3 and TRnr3 are activated, so that the node Nop and the node N3L are connected to each other and the node Non and the node N3R are connected to each other. Accordingly, a current flowing in the node Nop (i.e., a current according to a signal input to the non-inverting input terminal) flows in the node N3L and a current flowing in the node Non (i.e., a current according to a signal input to the inverting input terminal) flows in the node N3R.

On the other hand, the switching transistor TLnr4 is activated, so that the gate and drain of the current mirror transistor TcL are connected to each other. In addition, the switching transistor TRnr4 is activated, so that a voltage generated at the drain of the current mirror transistor TcR is output as a bias voltage $V_{bias}$. In this manner, a current mirror in which the current mirror transistor TcL is placed at the input side and the current mirror transistor TcR is placed at the output side is formed.

[Connection 2]

On the other hand, the control signal NR is set at the L level (inactive) and the control signal R is set at the H level (active). In this case, the switching transistors TLr3 and TRr3 are activated, so that the node Non and the node N3L are connected to each other and the node Nop and the node N3R are connected to each other. Accordingly, a current flowing in the node Non (i.e., a current according to a signal input to the inverting input terminal) flows in the node N3L and a current flowing in the node Nop (i.e., a current according to a signal input to the non-inverting input terminal) flows in the node N3R.

On the other hand, the switching transistor TRr4 is activated, so that the gate and drain of the current mirror transistor TcR are connected to each other. In addition, the switching transistor TLr4 is activated, so that a voltage generated at the drain of the current mirror transistor TcL is output as a bias voltage $V_{bias}$. In this manner, a current mirror in which the current mirror transistor TcR is placed at the input side and the current mirror transistor TcL is placed at the output side is formed.

<Effects>

As described above, the locations of the current mirror transistors TcR and TcL are replaced with each other according to the control signals R and NR, so that errors caused by the characteristic difference between the current mirror transistors TcR and TcL are averaged. In this manner, errors in output currents $I_{out}$ output from the current driver to display element circuits are not inclined toward one direction, so that variation in light-emission luminance of a display panel is reduced.

Figure 19:
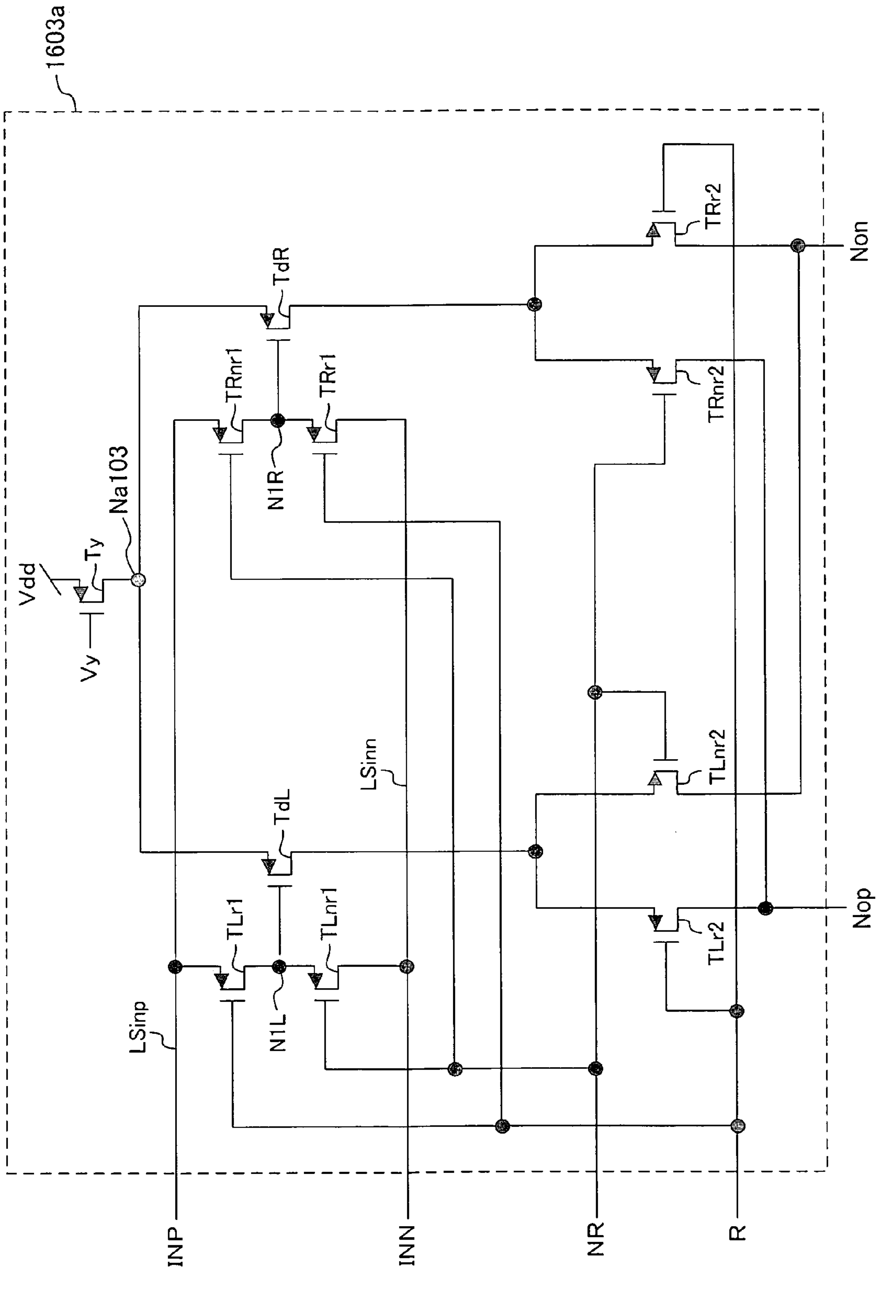
FIG. 19 is a view illustrating an internal configuration of a differential amplifier section included in a differential amplifier according to a sixteenth embodiment of the present invention.

The differential amplifier unit 1603*a* illustrated in FIG. 19 may be combined. In this case, the timings of switching the control signals R and NR do not necessarily coincide with each other.

EMBODIMENT 18

<Configuration>

Figure 21:
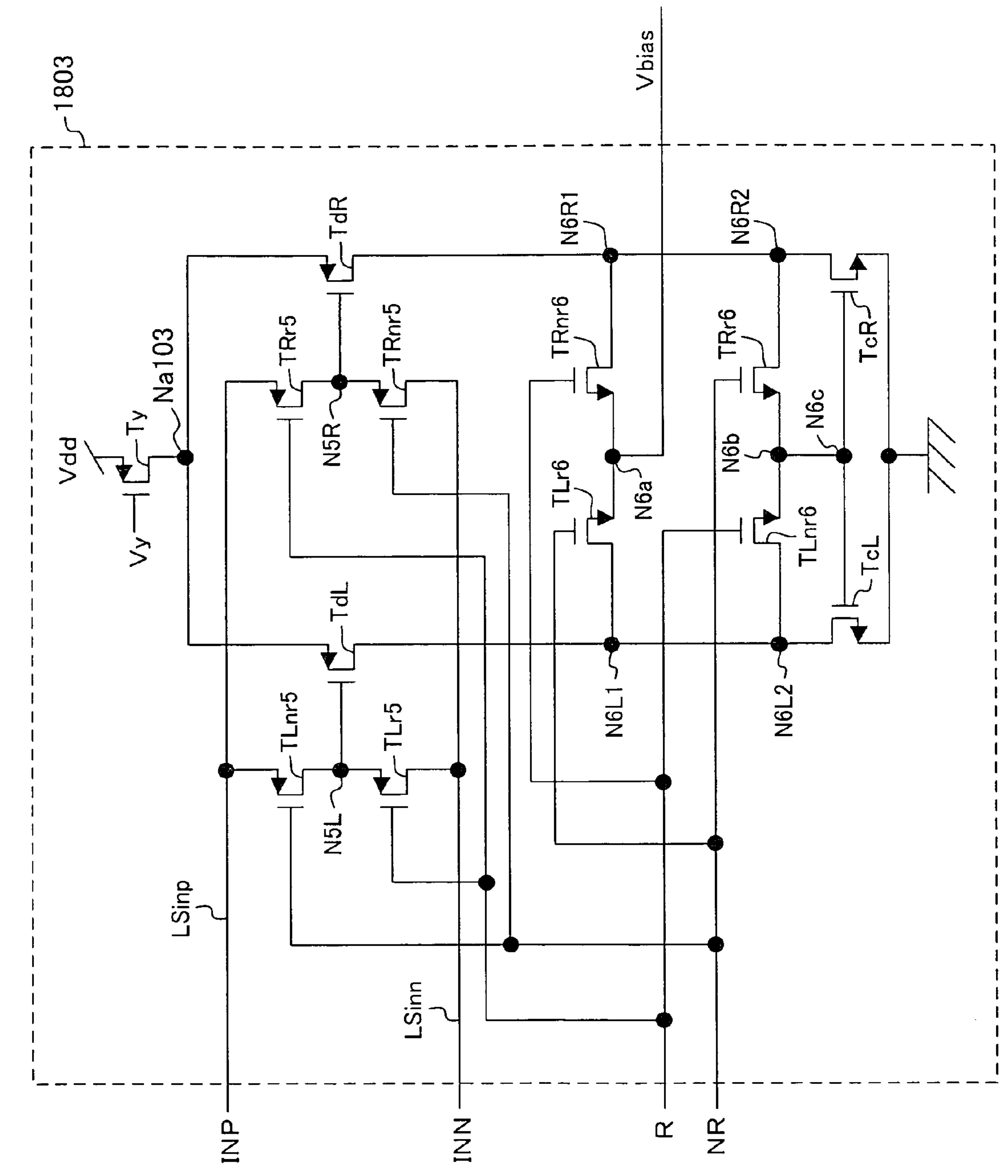
FIG. 21 is a view illustrating an internal configuration of a differential amplifier according to an eighteenth embodiment of the present invention.
Figure 22:
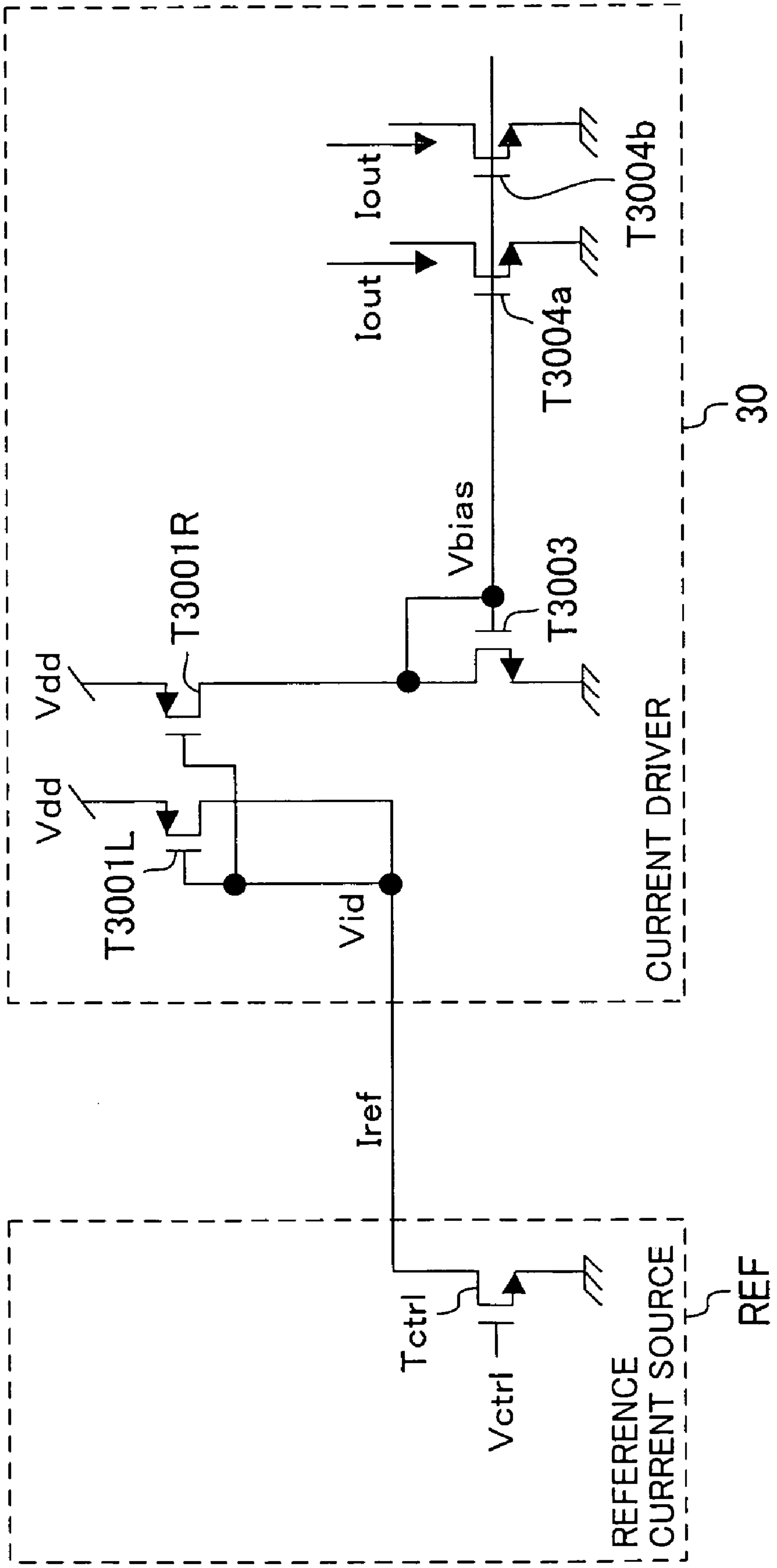
FIG. 22 is a view illustrating an overall configuration of a conventional current driver.

A current driver according to an eighteenth embodiment of the present invention includes a differential amplifier 1803, instead of the differential amplifier 103. The other part of the configuration is the same as that illustrated in FIG. 11. FIG. 21 illustrates an internal configuration of the differential amplifier 1803 used in this embodiment. The differential amplifier 1803 illustrated in FIG. 21 includes switching transistors TLr5, TLnr5, TRr5, TRnr5, TLr6, TLnr6, TRr6 and TRnr6, in addition to the components of the differential amplifier 103 illustrated in FIG. 18.

The switching transistors TLnr5 and TLr5 are provided in series between a signal line LSinp and a signal line LSinn. The switching transistor TLnr5 is provided between the signal line LSinp and a node N5L and receives a control signal NR at its gate. The switching transistor TLr5 is provided between the node N5L and the signal line LSinn and receives a control signal R at its gate. The node N5L is connected to the gate of a differential amplifier transistor TdL.

The switching transistors TRr5 and TRnr5 are provided in series between the signal line LSinp and the signal line LSinn. The switching transistor TRr5 is provided between the signal line LSinp and a node N5R and receives a control signal R at its gate. The switching transistor TRnr5 is provided between the node N5R and the signal line LSinn and receives a control signal NR at its gate. The node N5R is connected to the gate of a differential amplifier transistor TdR.

Nodes N6L1 and N6L2 are provided in series between the differential amplifier transistor TdL and a current mirror transistor TcL. The node N6L1 is provided between the differential amplifier transistor TdL and the node N6L2. The node N6L2 is provided between the node N6L1 and the current mirror transistor TcL.

Nodes N6R1 and N6R2 are provided in series between the differential amplifier transistor TdR and a current mirror transistor TcR. The node N6R1 is provided between the differential amplifier transistor TdR and the node N6R2. The node N6R2 is provided between the node N6R1 and the current mirror transistor TcR.

The switching transistors TLr6 and TRnr6 are provided in series between the node N6L1 and the node N6R1. The switching transistor TLr6 is provided between the node N6L1 and a node N6*a* and receives a control signal NR at its gate. The switching transistor TRnr6 is provided between the node N6*a* and the node N6R1 and receives a control signal R at its gate.

The switching transistors TLnr6 and TRr6 are connected in series between the node N6L2 and the node N6R2. The switching transistor TLnr6 is provided between the node N6L2 and a node N6*b* and receives a control signal R at its gate. The switching transistor TRr6 is provided between the node N6*b* and the node N6R2 and receives a control signal NR at its gate. The node N6*b* is connected to a node N6*c*.

When the control signals R and NR are at the L level, these signals are voltages for activating the switching transistors TLr5, TLnr5, TRr5 and TRnr5 (pMOS transistors) and inactivating the switching transistors TLr6, TLnr6, TRr6 and TRnr6 (nMOS transistors). On the other hand, when the control signals R and NR are at the H level, these signals are voltages for inactivating the switching transistors TLr5, TLnr5, TRr5 and TRnr5 (pMOS transistors) and activating the switching transistors TLr6, TLnr6, TRr6 and TRnr6 (nMOS transistors). For example, when the control signals R and NR are at the L level, these signals are voltages equal to the minimum voltage $V_{ddmin}$ in an internal power supply. When the control signals R and NR are at the H level, these signals are voltages equal to the maximum voltage $V_{ddmax}$ in the internal power supply.

<Operation>

Now, operation of the differential amplifier 1803 illustrated in FIG. 21 will be described.

[Connection 1]

First, the control signal NR is set at the L level and the control signal R is set at the H level. In this case, the switching transistors TLnr5 and TRnr5 are activated, so that the gate of the differential amplifier transistor TdL and the signal line LSinp are connected to each other and the gate of the differential amplifier transistor TdR and the signal line LSinn are connected to each other. Accordingly, a current according to a signal input to the non-inverting input terminal is generated in the differential amplifier transistor TdL and a current according to a signal input to the inverting input terminal is generated in the differential amplifier transistor TdR.

On the other hand, the switching transistor TLnr6 is activated, so that the gate and drain of the current mirror transistor TcL are connected to each other. In addition, the switching transistor TRnr6 is activated, so that a voltage generated at the drain of the current mirror transistor TcR is output as a bias voltage $V_{bias}$. In this manner, a current mirror in which the current mirror transistor TcL is placed at the input side and the current mirror transistor TcR is placed at the output side is formed.

[Connection 2]

On the other hand, the control signal NR is set at the H level and the control signal R is set at the L level. In this case, the switching transistors TLr5 and TRr5 are activated, so that the gate of the differential amplifier transistor TdL and the signal line LSinn are connected to each other and the gate of the differential amplifier transistor TdR and the signal line LSinp are connected to each other. Accordingly, a current according to a signal input to the inverting input terminal is generated in the differential amplifier transistor TdL and a current according to a signal input to the non-inverting input terminal is generated in the differential amplifier transistor TdR.

On the other hand, the switching transistor TRr6 is activated, so that the gate and drain of the current mirror transistor TcR are connected to each other. In addition, the switching transistor TLr6 is activated, so that a voltage generated at the drain of the current mirror transistor TcL is output as a bias voltage $V_{bias}$. In this manner, a current mirror in which the current mirror transistor TcR is placed at the input side and the current mirror transistor TcL is placed at the output side is formed.

<Effects>

As described above, the locations of the differential amplifier transistors TdR and TdL and the locations of the current mirror transistors TcR and TcL are replaced with each other according to the control signals R and NR, so that errors due to the characteristic differences between the differential amplifier transistors TdR and TdL and between the current mirror transistors TcR and TcL are averaged. In this manner, errors in output currents $I_{out}$ output from the current driver to display element circuits are not inclined toward one direction, so that variation in light-emission luminance of a display panel is reduced.

Current drivers according to the present invention are useful as, for example, current-driven display drivers such as drivers for organic EL panels. In addition, the inventive current drivers are applicable as, for example, printer drivers divided into a plurality of circuit blocks and providing outputs with the same current value with high accuracy.

What is claimed is:

1. A current driver outputting an output current having a current value according to the current value of a reference current, the current driver comprising:

a current-voltage converter connected between a first node and a second node and outputting a voltage having a voltage value according to the current value of the reference current;

a bias voltage generating transistor provided between the first node and the second node and connected in series with the current-voltage converter;

a driving transistor connected between the second node and an output current node at which the output current is output;

a third node at which a given voltage is generated;

a differential amplifier supplying a voltage having a voltage value according to the difference between a voltage at an interconnecting node provided between the current-voltage converter and the bias voltage generating transistor and a voltage at the third node to each gate of the bias voltage generating transistor and the driving transistor; and a connection switching circuit, wherein the current-voltage converter includes a first and second transistor each having a gate connected to a reference node receiving the reference current and each having a source connected to the first node, and wherein the connection switching circuit switches between a first connection state in which a drain of the first transistor is connected to the reference node while a drain of the second transistor is connected to the interconnecting node and a second connection state in which a drain of the first transistor is connected to the interconnecting node while a drain of the second transistor is connected to the reference node.

2. The current driver of claim 1, wherein the third node and the reference node are connected to each other.

3. The current driver of claim 1, wherein the connection switching section includes:

a first switching element connected between the first transistor and the reference node;

a second switching element connected between the first transistor and the interconnecting node;

a third switching element connected between the second transistor and the reference node; and a fourth switching element connected between the second transistor and the interconnecting node, the first and fourth switching elements are turned on and the second and third switching elements are turned off in the first connection state, and the second and third switching elements are turned on and the first and fourth switching elements are turned off in the second connection state.

4. The current driver of claim 1, further comprising a voltage clamping transistor connected between the interconnecting node and the bias voltage generating transistor and receiving a given clamping voltage at a gate thereof.

5. The current driver of claim 4, further comprising an output voltage clamping transistor connected between the output current node and the driving transistor and having a gate connected to the gate of the voltage clamping transistor.

6. A current driver outputting an output current having a current value according to the current value of a reference current, the current driver comprising:

a current-voltage converter connected between a first node and a second node and outputting a voltage having a voltage value according to the current value of the reference current;

a bias voltage generating transistor provided between the first node and the second node and connected in series with the current-voltage converter;

a driving transistor connected between the second node and an output current node at which the output current is output;

a third node which is a reference node given the reference current;

a differential amplifier supplying a voltage having a voltage value according to the difference between a voltage at an interconnecting node provided between the current-voltage converter and the bias voltage generating transistor and a voltage at the third node to each gate of the bias voltage generating transistor and the driving transistor; and a connection switching circuit, wherein the current-voltage converter includes:

a first resistance one end of which is connected to the first node; and a second resistance one end of which is connected to the first node and having a resistance value according to a resistance value of the first resistance, and, wherein the connection switching circuit switches between a first connection state in which the other end of the first resistance is connected to the third node while the other end of the second resistance is connected to the interconnecting node and a second connection state in which the other end of the first resistance is connected to the interconnecting node while the other end of the second resistance is connected to the third node.

7. The current driver of claim 6, wherein the connection switching section includes:

a first switching element connected between the first resistance and the third node;

a second switching element connected between the second resistance and the third node;

a third switching element connected between the first resistance and the bias voltage generating transistor;

a fourth switching element connected between the second resistance and the bias voltage generating transistor;

a fifth switching element connected between the first resistance and a non-inverting input terminal of the differential amplifier;

a sixth switching element connected between the second resistance and the non-inverting input terminal of the differential amplifier;

a seventh switching element connected between the first resistance and an inverting input terminal of the differential amplifier; and an eighth switching element connected between the second resistance and the inverting input terminal of the differential amplifier, the first, fourth, sixth and seventh switching elements are turned on and the second, third, fifth and eighth switching elements are turned off in the first connection state, and the second, third, fifth and eighth switching elements are turned on and the first, fourth, sixth and seventh switching elements are turned off in the second connection state.

8. The current driver of claim 6, wherein the differential amplifier includes:

a first transistor and a third transistor connected in series between the first node and the second node; and a second transistor and a fourth transistor connected in series between the first node and the second node, the first transistor is connected between the first node and the third transistor and receives, at a gate thereof, the voltage at the interconnecting node, the second transistor is connected between the first node and the fourth transistor and receives, at a gate thereof, the voltage at the third node, the third transistor is connected between the first transistor and the second node and has a drain and a gate connected to each other, and the fourth transistor is connected between the second transistor and the second node and has a gate connected to the gate of the third transistor.

9. The current driver of claim 8, wherein the differential amplifier further includes a connection switching section for switching between a first connection state and a second connection state, the connection switching section connects the first transistor between the first node and the third transistor, connects the second transistor between the first node and the fourth transistor, applies the voltage at the interconnecting node to the gate of the first transistor and applies the voltage at the third node to the gate of the second transistor, in the first connection state, and the connection switching section connects the first transistor between the first node and the fourth transistor, connects the second transistor between the first node and the third transistor, applies the voltage at the interconnecting node to the gate of the second transistor and applies the voltage at the third node to the gate of the first transistor, in the second connection state.

10. The current driver of claim 9, wherein the connection switching section includes:

a first switching element connected between the interconnecting node and the gate of the first transistor;

a second switching element connected between the interconnecting node and the gate of the second transistor;

a third switching element connected between the third node and the gate of the first transistor;

a fourth switching element connected between the third node and the gate of the second transistor;

a fifth switching element connected between the first transistor and the third transistor;

a sixth switching element connected between the first transistor and the fourth transistor;

a seventh switching element connected between the second transistor and the third transistor; and an eighth switching element connected between the second transistor and the fourth transistor, the first, fourth, fifth and eighth switching elements are turned on and the second, third, sixth and seventh switching elements are turned off in the first connection state, and the second, third, sixth and seventh switching elements are turned on and the first, fourth, fifth and eighth switching elements are turned off in the second connection state.

11. The current driver of claim 8, wherein the gate of the third transistor is connected to the gate of the fourth transistor, the differential amplifier further includes a connection switching section for switching between a first connection state and a second connection state, the connection switching section connects the third transistor between the first transistor and the second node, connects the fourth transistor between the second transistor and the second node and connects the gate and drain of the third transistor to each other, in the first connection state, and the connection switching section connects the fourth transistor between the first transistor and the second node, connects the third transistor between the second transistor and the second node and connects the gate and drain of the fourth transistor to each other, in the second connection state.

12. The current driver of claim 11, wherein the connection switching section includes:

a first switching element connected between the first transistor and the third transistor;

a second switching element connected between the first transistor and the fourth transistor;

a third switching element connected between the second transistor and the third transistor;

a fourth switching element connected between the second transistor and the fourth transistor;

a fifth switching element connected between the gate and drain of the third transistor;

a sixth switching element connected between the gate and drain of the fourth transistor;

a seventh switching element connected between the drain of the third transistor and the fifth node; and an eighth switching element connected between the drain of the fourth transistor and the fifth node, the first, fourth, fifth and eighth switching elements are turned on and the second, third, sixth and seventh switching elements are turned off in the first connection state, and the second, third, sixth and seventh switching elements are turned on and the first, fourth, fifth and eighth switching elements are turned off in the second connection state.

13. The current driver of claim 8, wherein the gate of the third transistor is connected to the gate of the fourth transistor, the differential amplifier further includes a connection switching section for switching between a first connection state and a second connection state, the connection switching section applies the fourth voltage at the interconnecting node to the gate of the first transistor, applies the third voltage at the third node to the gate of the second transistor and connects the gate and drain of the fourth transistor to each other, in the first connection state, and the connection switching section applies the fourth voltage at the interconnecting node to the gate of the second transistor, applies the third voltage at the third node to the gate of the first transistor and connects the gate and drain of the third transistor to each other, in the second connection state.

14. The current driver of claim 13, wherein the connection switching section includes:

a first switching element connected between the third node and the gate of the first transistor;

a second switching element connected between the third node and the gate of the second transistor;

a third switching element connected between the interconnecting node and the gate of the first transistor;

a fourth switching element connected between the interconnecting node and the gate of the second transistor;

a fifth switching element connected between the gate and drain of the third transistor;

a sixth switching element connected between the gate and drain of the fourth transistor;

a seventh switching element connected between the drain of the third transistor and the fifth node; and an eighth switching element connected between the drain of the fourth transistor and the fifth node, the first, fourth, sixth and seventh switching elements are turned on and the second, third, fifth and eighth switching elements are turned off in the first connection state, and the second, third, fifth and eighth switching elements are turned on and the first, fourth, sixth and seventh switching elements are turned off in the second connection state.

* * * * *